(12) United States Patent
Han et al.

(10) Patent No.: US 9,853,003 B1
(45) Date of Patent: Dec. 26, 2017

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Mi Ja Han, Suwon-si (KR); Seong Hee Choi, Suwon-si (KR); Han Kim, Suwon-si (KR); Moon Il Kim, Suwon-si (KR); Dae Hyun Park, Suwon-si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/480,573

(22) Filed: Apr. 6, 2017

(30) Foreign Application Priority Data

Jul. 26, 2016 (KR) .................. 10-2016-0094624
Mar. 17, 2017 (KR) .................. 10-2017-0033803

(51) Int. Cl.
*H01L 23/00* (2006.01)
*H01L 23/48* (2006.01)
(Continued)

(52) U.S. Cl.
CPC ........ *H01L 23/645* (2013.01); *H01L 23/3128* (2013.01); *H01L 24/02* (2013.01); *H01L 24/13* (2013.01); *H01L 2224/02331* (2013.01); *H01L 2224/02373* (2013.01); *H01L 2224/02379* (2013.01); *H01L 2224/02381* (2013.01);
(Continued)

(58) Field of Classification Search
CPC ....... H01L 23/3128; H01L 2924/19105; H01L 2224/02331; H01L 2224/05073; H01L 2924/1206; H01L 2224/13024; H01L 23/49827; H01L 23/28; H01L 23/481; H01L 23/5384; H01L 2224/02379; H01L 24/02; H01L 24/13; H01L 2924/181
See application file for complete search history.

(56) References Cited

U.S. PATENT DOCUMENTS

| | | | |
|---|---|---|---|
| 9,269,643 B2 | 2/2016 | Liao | |
| 2011/0298088 A1* | 12/2011 | Elian | H01F 17/0006 257/531 |

(Continued)

FOREIGN PATENT DOCUMENTS

| | | |
|---|---|---|
| JP | 2013-080846 A | 5/2013 |
| JP | 2014-090080 A | 5/2014 |

*Primary Examiner* — Jasmine Clark
(74) *Attorney, Agent, or Firm* — McDermott Will & Emery LLP

(57) ABSTRACT

A fan-out semiconductor package includes: a first connection member having a through-hole; a semiconductor chip disposed in the through-hole of the first connection member and having an active surface having connection pads disposed thereon and an inactive surface opposing the active surface; an encapsulant encapsulating at least portions of the first connection member and the inactive surface of the semiconductor chip; and a second connection member disposed on the first connection member and the active surface of the semiconductor chip. The first connection member and the second connection member include, respectively, redistribution layers electrically connected to the connection pads of the semiconductor chip, and the first connection member includes a coil pattern layer electrically connected to the connection pads of the semiconductor chip.

20 Claims, 18 Drawing Sheets

(51) Int. Cl.
*H01L 29/40* (2006.01)
*H01L 23/64* (2006.01)
*H01L 23/31* (2006.01)

(52) U.S. Cl.
CPC ............... *H01L 2224/13024* (2013.01); *H01L 2924/19042* (2013.01); *H01L 2924/19105* (2013.01)

(56) References Cited

U.S. PATENT DOCUMENTS

2014/0118976 A1   5/2014  Yoshikawa et al.
2015/0001708 A1*  1/2015  Lin ..................... H01L 24/20
                                          257/737

\* cited by examiner

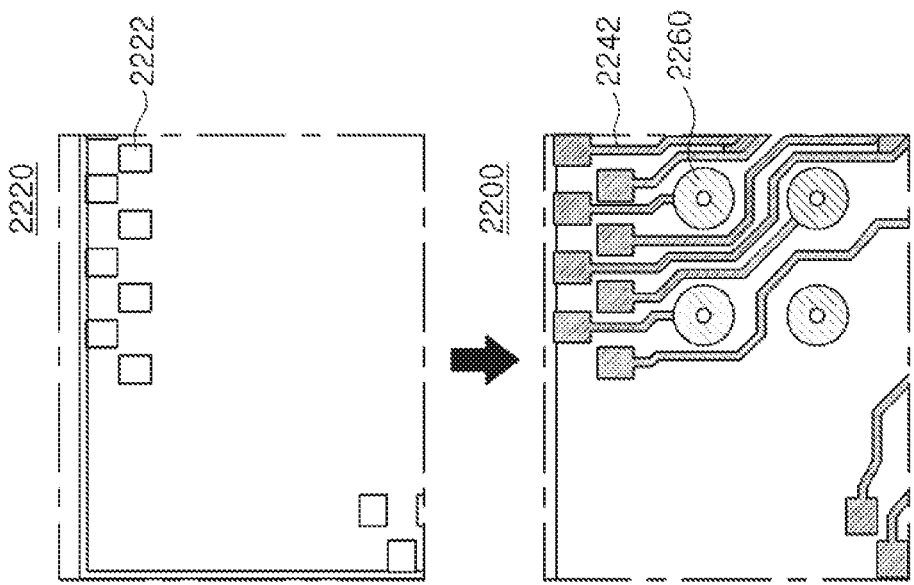
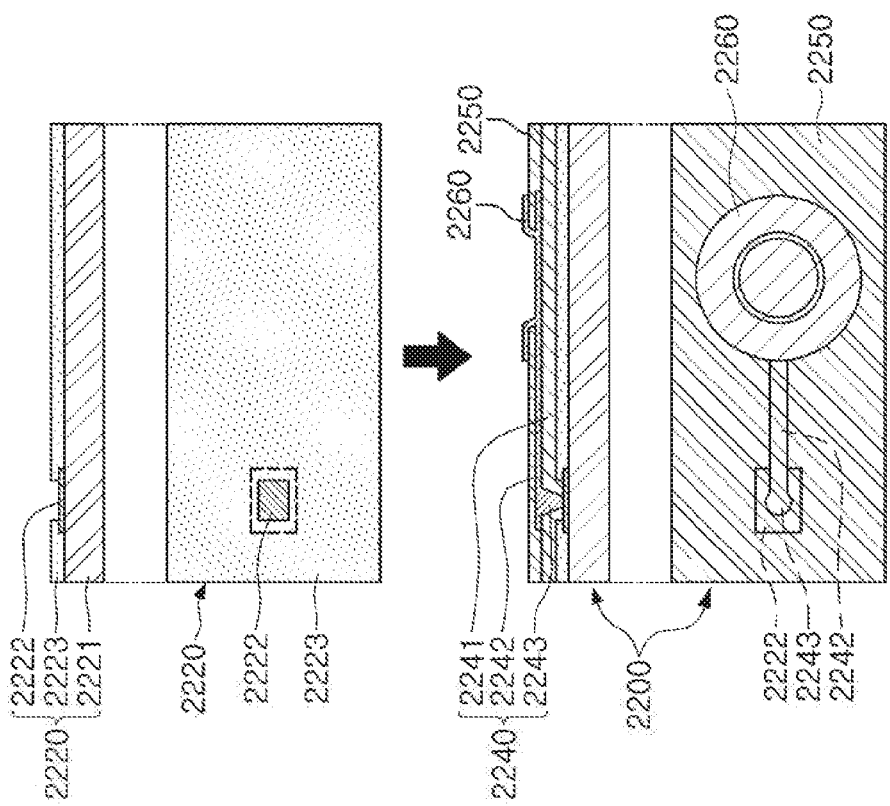
FIG. 3B
FIG. 3A

US 9,853,003 B1

FAN-OUT SEMICONDUCTOR PACKAGE

CROSS-REFERENCE TO RELATED APPLICATION(S)

This application claims the benefit of priority to Korean Patent Application Nos. 10-2016-0094624 filed on Jul. 26, 2016 and 10-2017-0033803 filed on Mar. 17, 2017 in the Korean Intellectual Property Office, the entire disclosure of which is incorporated herein by reference.

BACKGROUND

1. Technical Field

The present disclosure relates to a semiconductor package, and more particularly, to a fan-out semiconductor package in which connection terminals may be extended outwardly of a region in which a semiconductor chip is disposed.

2. Description of Related Art

Recently, a significant recent trend in the development of semiconductor chip-related technology has been reducing the size of semiconductor chips. Therefore, in the area of package technology, in accordance with a rapid increase in demand for small-sized semiconductor chips, or the like, there has been increased demand for the implementation of a semiconductor package having a compact size while including a plurality of pins.

One type of package technology suggested to satisfy the technical demand as described above is a fan-out package. Such a fan-out package has a compact size and may allow a plurality of input/output (I/O) pins to be implemented by redistributing connection terminals outwardly of a region in which a semiconductor chip is disposed.

SUMMARY

An aspect of the present disclosure may provide a fan-out semiconductor package in which power supplying efficiency is excellent and a cost may be reduced.

One of several solutions suggested in the present disclosure is to introduce a first connection member having a through-hole in which a semiconductor chip is disposed and form a coil pattern layer in the first connection member to be electrically connected to the semiconductor chip to implement a power inductor.

According to an aspect of the present disclosure, a fan-out semiconductor package may include: a first connection member having a through-hole; a semiconductor chip disposed in the through-hole of the first connection member and having an active surface having connection pads disposed thereon and an inactive surface opposing the active surface; an encapsulant encapsulating at least portions of the first connection member and the inactive surface of the semiconductor chip; and a second connection member disposed on the first connection member and the active surface of the semiconductor chip. The first connection member and the second connection member include, respectively, redistribution layers electrically connected to the connection pads of the semiconductor chip, and the first connection member includes a coil pattern layer electrically connected to the connection pads of the semiconductor chip.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Figure 1:
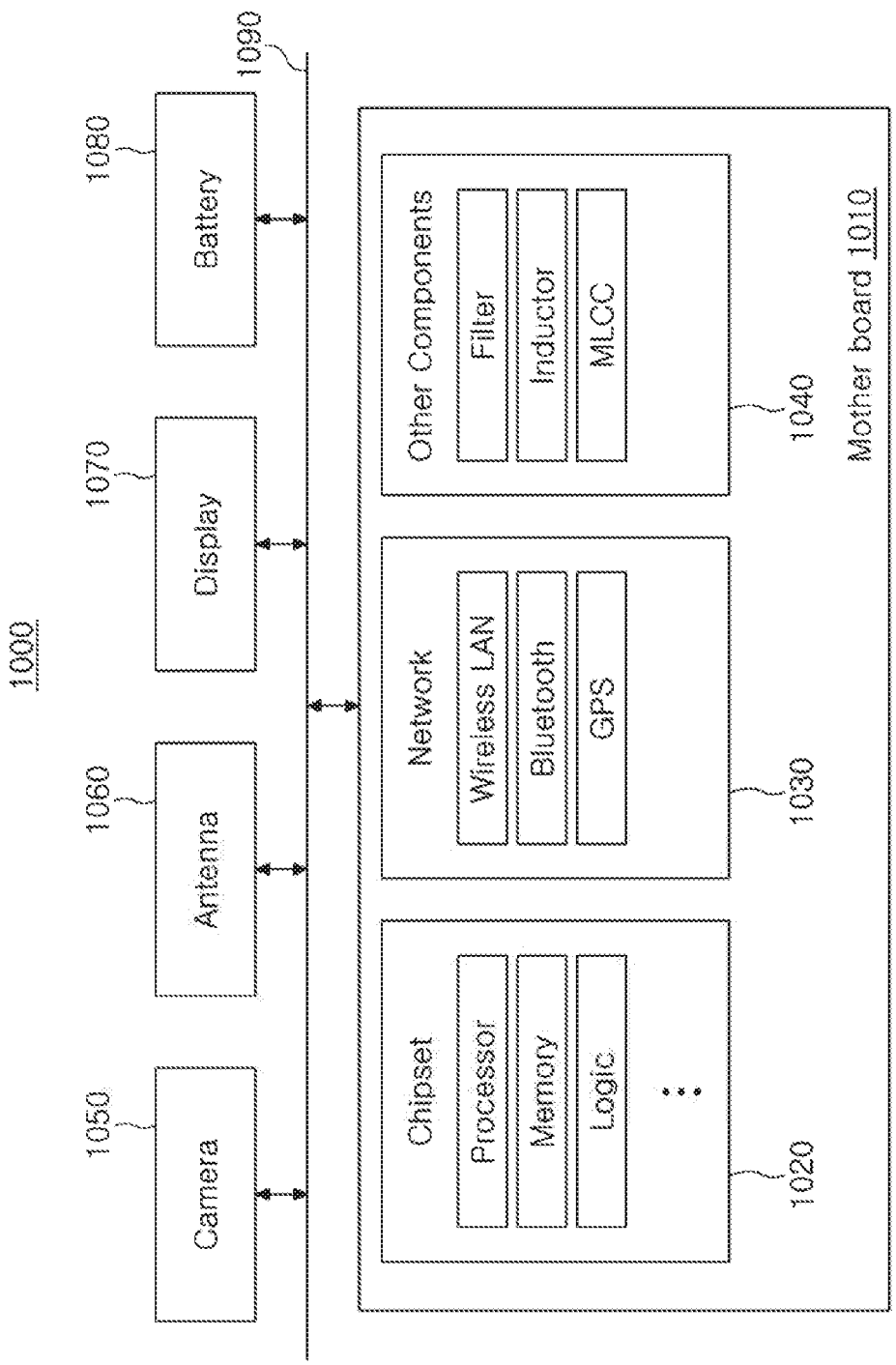
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the attached drawings. For example, a first connection member is disposed at a level higher than a second connection member. However, the claims are not limited thereto. In the present disclosure, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a main board 1010. The main board 1010 may include chip-related components 1020, network-related components 1030, other components 1040, and the like, physically or electrically connected thereto. These components may be connected to other components to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip-related components 1020 are not limited thereto, and may include other types of chip related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, and may include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may include passive components used for various other purposes, or the like. In addition, other components 1040 may be combined with each other, together with the chip-related components 1020 or the network-related components 1030 described above.

Depending on type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. However, these other components are not limited thereto, and may include other components used for various purposes depending on type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
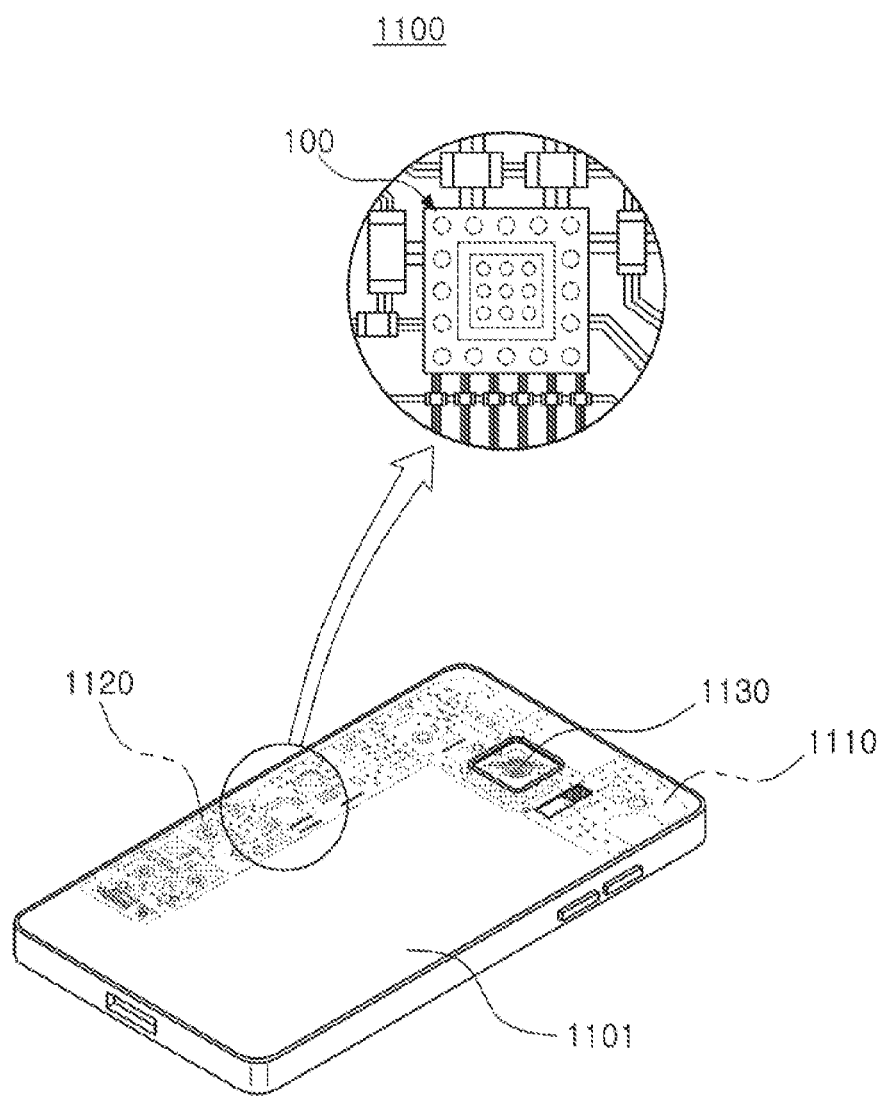
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as the camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product itself, and may be damaged due to external physical or chemical impacts. Therefore, the semiconductor chip is not used itself, but is packaged and used in an electronic device, or the like, in a package state.

Semiconductor packaging is required due to a difference in a circuit width existing between the semiconductor chip and a main board of the electronic device with regard to electrical connectivity. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and a packaging technology for buffering a difference in a circuit width between the semiconductor chip and the main board is required.

A semiconductor package manufactured using packaging technology may be divided into a fan-in semiconductor package and a fan-out semiconductor package depending on a structure and a purpose thereof.

The fan-in semiconductor package and the fan-out semiconductor package will hereinafter be described in more detail with reference to the drawings.

Fan-In Semiconductor Package

FIGS. 3A and 3B are schematic cross-sectional views illustrating states of a fan-in semiconductor package before and after being packaged.

Figure 4:
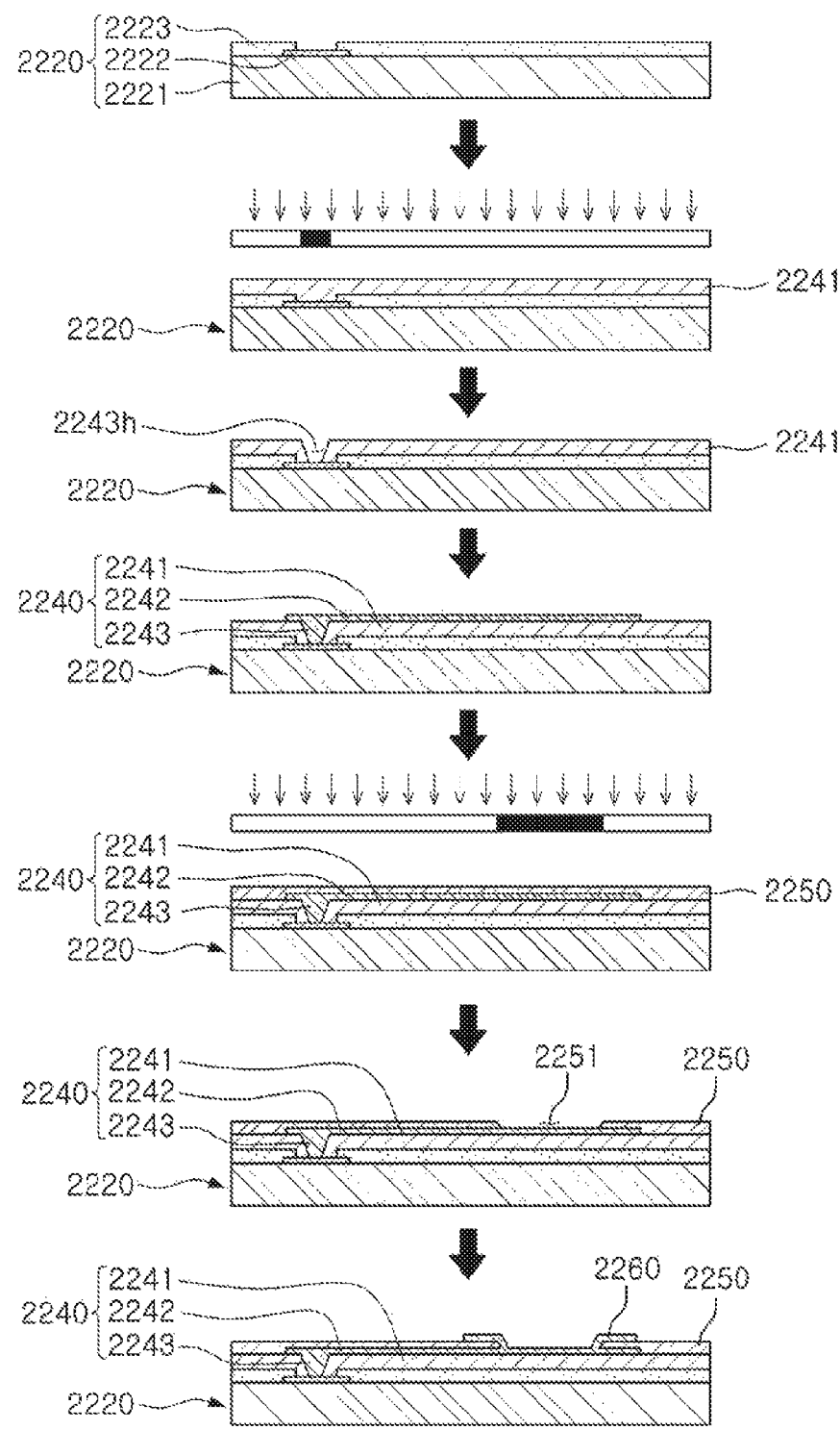
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. Here, since the connection pads 2222 are very small, it is difficult to mount the integrated circuit (IC) on an intermediate level printed circuit board (PCB) as well as on the main board of the electronic device, or the like.

Therefore, depending on a size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as photoimagable dielectric (PID) resin, forming via holes 2243*h* opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads of the semiconductor chip, input/output (I/O) terminals for example, are disposed inside the semiconductor chip, may have excellent electrical characteristics and may be produced at low cost. Therefore, many elements mounted in a smartphone have been manufactured in fan-in semiconductor package form. In detail, many elements mounted in the smartphone have been developed to allow for rapid signal transfer while having a compact size.

However, since all of the I/O terminals need to be disposed inside the semiconductor chip in the fan-in semiconductor package, the fan-in semiconductor package has a significant spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the main board of the electronic device.

Figure 5:
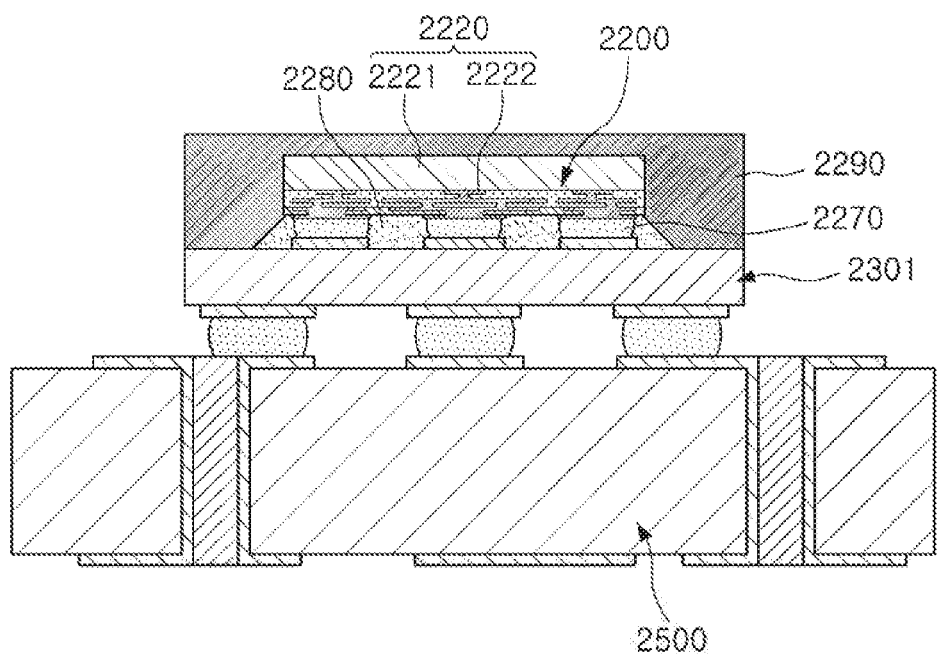
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
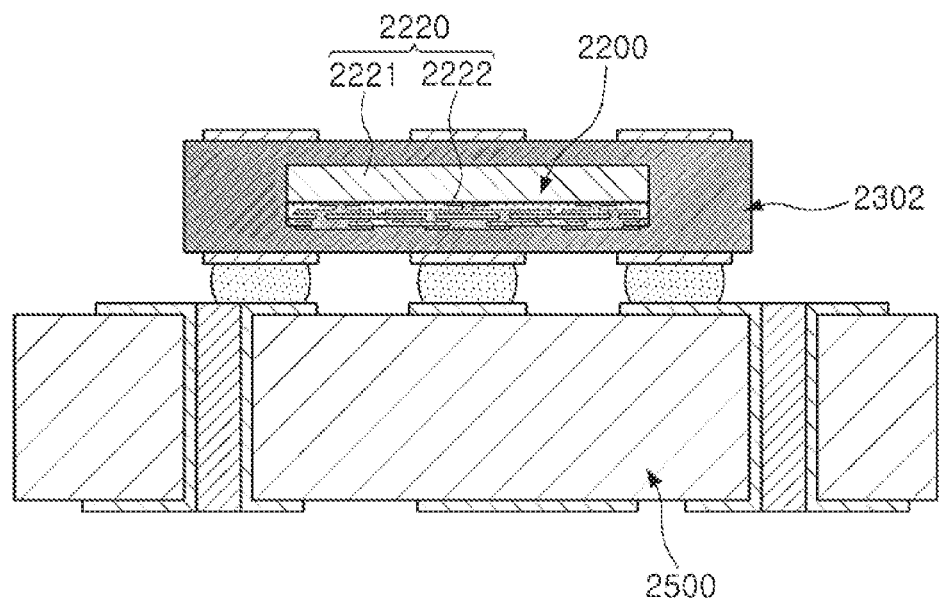
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in a state in which it is mounted on the interposer substrate 2301. Here, solder balls 2270, and the like, may be fixed by an underfill resin 2280, or the like, and an external surface of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and may then be mounted on the main board of the electronic device through a packaging process or may be mounted and used on the main board of the electronic device in a state in which it is embedded in the interposer substrate.

Fan-Out Semiconductor Package

Figure 7:
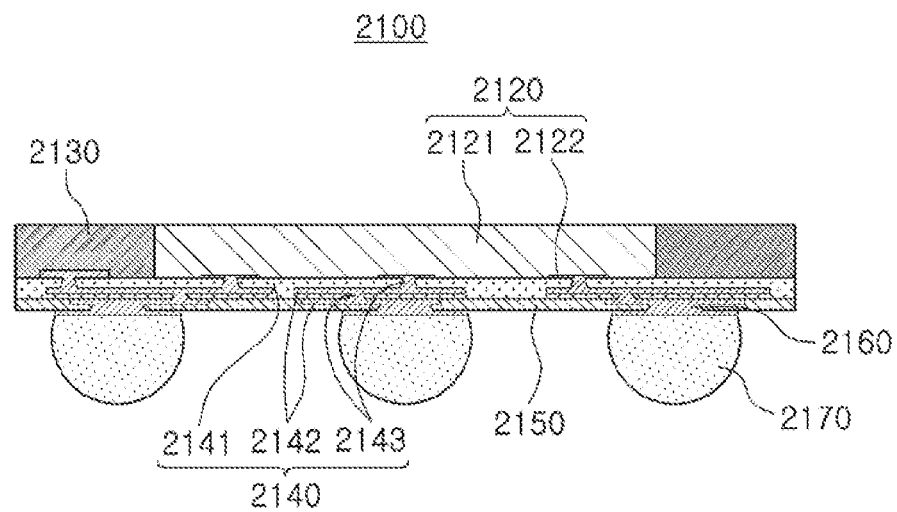
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer, and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all of the I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
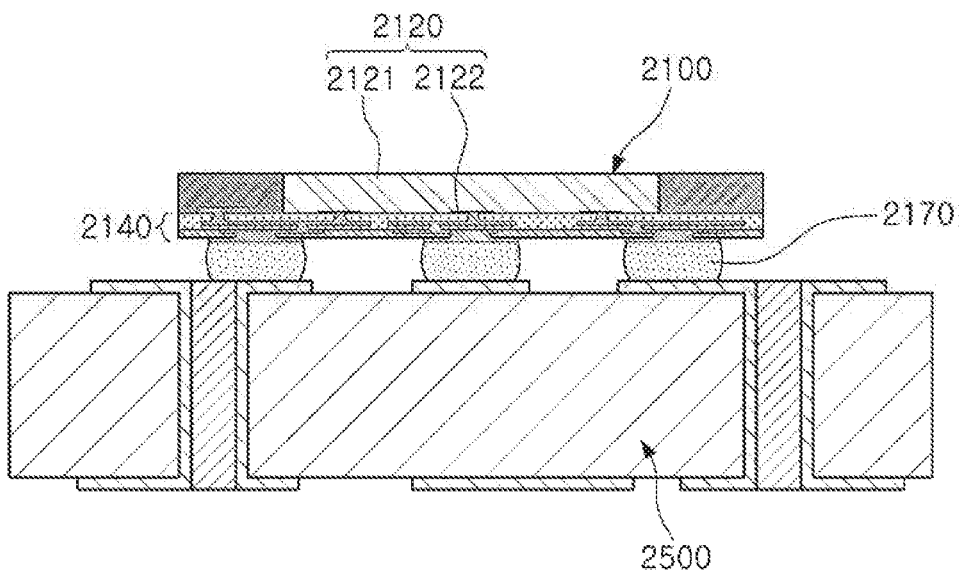
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 up to a fan-out region that is out of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness less than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and which is conceptually different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package in which power supplying efficiency is excellent and a cost may be reduced will hereinafter be described with reference to the drawings.

Figure 9A:
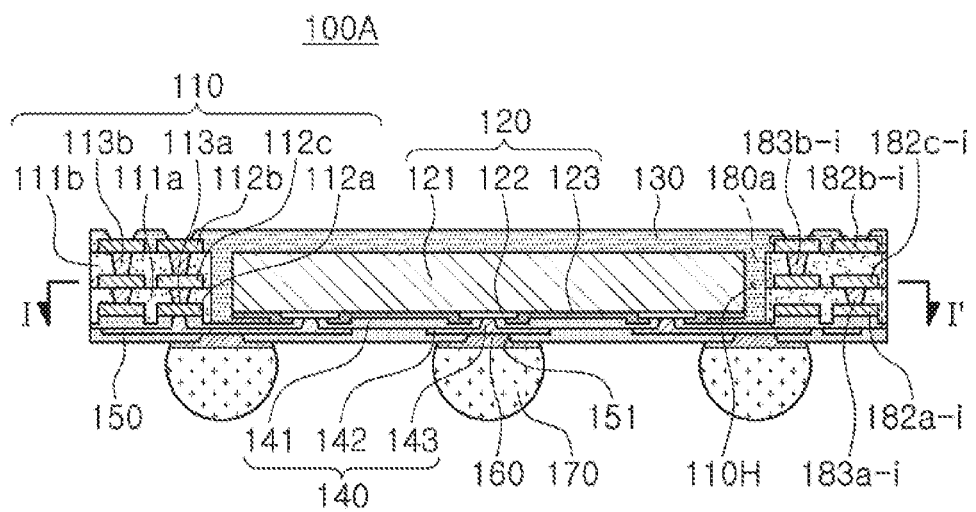
FIGS. 9A and 9B are schematic views illustrating a fan-out semiconductor package according to an exemplary embodiment in the present disclosure.
Figure 9B:
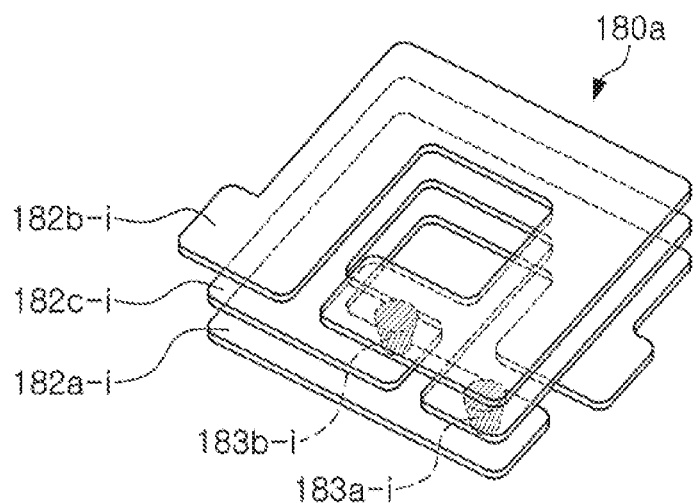

FIGS. 9A and 9B are schematic views illustrating a fan-out semiconductor package according to an exemplary embodiment in the present disclosure.

Figure 10:
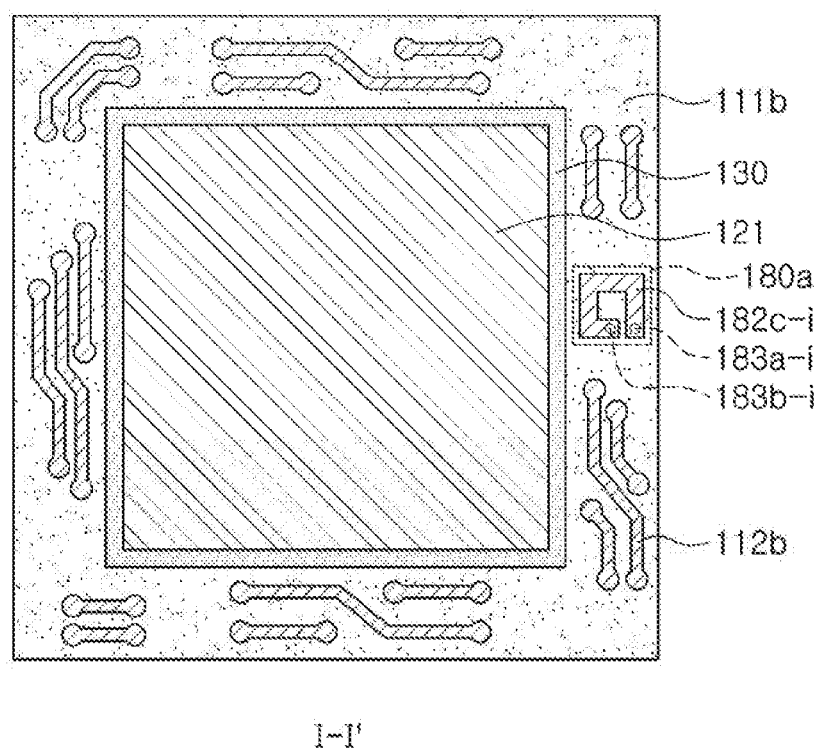
FIG. 10 is a schematic plan view taken along line I-I' of the fan-out semiconductor package of FIG. 9A.

FIG. 10 is a schematic plan view taken along line I-I' of the fan-out semiconductor package of FIG. 9A.

Referring to the drawings, a fan-out semiconductor package 100A according to the present exemplary embodiment may include a first connection member 110 having a through-hole 110H, a semiconductor chip 120 disposed in the through-hole 110H and having connection pads 122 disposed on one surface thereof, an encapsulant 130 encapsulating at least portions of the first connection member 110 and the semiconductor chip 120, a second connection member 140 disposed on the first connection member 110 and one surface of the semiconductor chip 120 and redistributing the connection pads 122 up to a fan-out region, a passivation layer 150 disposed on one surface of the second connection member 140 and having openings 151 exposing at least portions of a redistribution layer 142 of the second connection member 140, an underbump metal layer 160 disposed on the openings 151 of the passivation layer 150, and connection terminals 170 disposed on the underbump metal layer 160 and electrically connected to the connection pads 122 through the second connection member 140. In this case, a coil 180a such as a power inductor (PI), electrically connected to the semiconductor chip 120 may be formed in a pattern shape on the first connection member 110.

Recently, in accordance with an increase in a demand of high speed portable electronic devices, the necessity to smoothly supply power to a semiconductor package has increased. Therefore, a voltage regulator such as a direct current (DC)-DC converter, or the like, has been used in order to smoothly receive power supplied from a power supply, and various passive components have been connected to a power line from a main board of the electronic device to a semiconductor chip. For example, stabilization of power has been promoted by distributing power input from a battery, or the like, in a power management integrated circuit (PMIC) mounted on a main board and supplying the distributed power to the semiconductor package through a chip-type power inductor mounted on the main board. However, in this form, a path among the semiconductor package, the PMIC, and the power inductor is significantly large, such that power supplying efficiency is low. In addition, the chip-type power inductor that is separately manufactured and mounted on the main board of the electronic device or is embedded in the second connection member has limitations in terms of reducing costs. In addition, the chip-type power inductor that is separately manufactured and mounted on the main board of the electronic device or is embedded in the second connection member has a limitation in implementing a quality (Q) factor due to a spatial limitation, or the like.

On the other hand, in the fan-out semiconductor package 100A according to the present exemplary embodiment, the coil 180a such as the power inductor may be formed in the pattern shape on the first connection member 110 surrounding the semiconductor chip 120, and a connection path between the power inductor and the semiconductor chip 120 may thus be very short. Resultantly, power supplying efficiency may be significantly increased. In addition, the power inductor does not need to be manufactured and mounted in a separate chip form, and a cost may thus be reduced. In addition, space utilization is more excellent than that of a power inductor mounted in a separate chip form, such that a high Q factor may be implemented.

The respective components included in the fan-out semiconductor package according to the exemplary embodiment will hereinafter be described in more detail.

The first connection member 110 may support the fan-out semiconductor package 100A. In addition, the first connection member 110 may allow uniformity of a thickness of the encapsulant 130 to be easily secured. In addition, the first connection member 110 may provide a routing region to form a redistribution layer, thereby reducing the number of layers of the second connection member 140. Resultantly, a defect occurring in a process of forming the second connection member 140 may be solved. The first connection member 110 may have the through-hole 110H. The through-hole 110H may have the semiconductor chip 120 disposed therein to be spaced apart from the first connection member 110 by a predetermined distance. That is, side surfaces of the semiconductor chip 120 may be surrounded by the first connection member 110. However, a form of the first connection member 110 is not limited thereto, but may be variously modified into other forms.

The first connection member 110 may include a first insulating layer 111a contacting the second connection member 140, a first redistribution layer 112a contacting the second connection member 140 and embedded in the first insulating layer 111a, a second redistribution layer 112b disposed on the other surface of the first insulating layer 111a opposing the surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. Since the first connection member 110 may include a large number of redistribution layers 112a, 112b, and 112c, the second connection member 140 may be further simplified. Therefore, a decrease in yield depending on a defect occurring in a process of forming the second connection member 140 may be improved. Since the first redistribution layer 112a is embedded in the first insulating layer 111a, an insulating distance of an insulating layer 141 of the second connection member 140 may be relatively constant. The first redistribution layer 112a may be recessed in the first insulating layer 111a, such that a lower surface of the first insulating layer 111a may have a step with respect to a lower surface of the first redistribution layer 112a. Therefore, a phenomenon in which a material of the encapsulant 130 is bled to the first redistribution layer 112a may be prevented. The first to third redistribution layers 112a, 112b, and 112c may be electrically connected to each other through via layers 113a and 113b penetrating through the first and second insulating layers 111a and 111b.

Materials of the first and second insulating layers 111a and 111b are not particularly limited as long as the first and second insulating layers 111a and 111b may support the fan-out semiconductor package. For example, an insulating material may be used as materials of the first and second insulating layers 111a and 111b. In this case, a thermosetting resin such as an epoxy resin, a thermoplastic resin such as a polyimide resin, a resin containing a reinforcement material such as a glass cloth or an inorganic filler impregnated in the thermosetting resin and the thermoplastic resin, such as prepreg, Ajinomoto Build up Film (ABF), FR-4, Bismaleimide Triazine (BT), or the like, may be used as the insulating material. Alternatively, a photoimagable dielectric (PID) resin may also be used as the insulating material.

The redistribution layers 112a, 112b, and 112c may serve to redistribute the connection pads 122 of the semiconductor chip 120, and a conductive material such as copper (Cu), aluminum (Al), silver (Ag), tin (Sn), gold (Au), nickel (Ni), lead (Pb), titanium (Ti), or alloys thereof, may be used as a material of each of the redistribution layers 112a, 112b, and 112c. The redistribution layers 112a, 112b, and 112c may perform various functions depending on designs of their corresponding layers. For example, the redistribution layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a, 112b, and 112c may include via pads, connection terminal pads, and the like. A surface treatment layer may further be formed on portions of the redistribution layer 112c exposed from the redistribution layers 112a, 112b, and 112c through openings 131 formed in the encapsulant 130, if necessary. The surface treatment layer is not particularly limited as long as it is known in the related art, and may be formed by using, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The via layers 113a and 113b may electrically connect the redistribution layers 112a and 112b formed on different layers, resulting in an electrical path in the first connection member 110. A conductive material such as copper (Cu), aluminum (Al), silver (Ag), tin (Sn), gold (Au), nickel (Ni), lead (Pb), titanium (Ti), or alloys thereof, may be used as a material of each of the via layers 113a and 113b. Each of the via layers 113a and 113b may be entirely filled with the conductive material, or the conductive material may also be formed along a wall of each of the via holes. In addition, each of the via layers 113a and 113b may have all of the shapes known in the related art, such as a tapered shape, a cylindrical shape, and the like.

The first connection member 110 may include a first coil pattern layer 112a-i contacting the second connection member 140 and embedded in the first insulating layer 111a, a second coil pattern layer 112b-i disposed on the other surface of the first insulating layer 111a opposing the surface of the first insulating layer 111a in which the first coil pattern layer 112a-i is embedded, and a third coil pattern layer 112c-i disposed on the second insulating layer 111b. The first to third coil pattern layers 112a-i, 112b-i, and 112c-i may include coil patterns, respectively, and these coil patterns may be electrically connected to each other through vias 183a-i and 183b-i penetrating through the first and second insulating layers 111a and 111b to form the coil 180a of which a central axis corresponds to a stacking direction of the first to third coil pattern layers 112a-i, 112b-i, and 112c-i. The first to third coil pattern layers 112a-i, 112b-i, and 112c-i may be formed by the known plating process such as electrolytic copper plating, electroless copper plating, or the like. In more detail, the first to third coil pattern layers 112a-i, 112b-i, and 112c-i may be formed using a method such as chemical vapor deposition (CVD), physical vapor deposition (PVD), sputtering, a subtractive process, an additive process, a semi-additive process (SAP), a modified semi-additive process (MSAP), or the like, but are not limited thereto. The coil 180a may be a power inductor electrically connected to the semiconductor chip 120, but is not limited thereto. One coil 180a is illustrated in the drawing, but the number of coils 180a is not limited thereto. That is, a plurality of coils 180a may also be disposed at various positions of the first connection member 110. The patterns constituting the coil 180a may be implemented in various shapes such as a rectangular shape, a square shape, a circular shape, an oval shape, and the like, when viewed from a plane. On the other hand, referring to FIG. 10, when four regions surrounding the semiconductor chip 120 of the first connection member 110 are referred to as a first region through a fourth region, the coil 180a may be formed, for example, in a single region of the first region through the fourth region, but is not limited thereto.

The semiconductor chip 120 may be an integrated circuit (IC) provided in an amount of several hundreds to several millions of elements or more integrated in a single chip. The IC may be the known semiconductor chip, for example, an application processor (AP) such as a central processor (for example, a CPU), a graphic processor (for example, a GPU), a digital signal processor, a cryptographic processor, a microprocessor, a microcontroller, or the like. Alternatively, the IC may be a PMIC. The AP and the PMIC, which are the semiconductor chip 120, may be disposed together with each other in the through-hole 110H of the first connection member 110. Alternatively, the AP and the PMIC may be integrated with each other as one chip and be disposed in the through-hole 110H of the first connection member 110. One end and the other end of the coil 180a such as the power inductor (PI) may be electrically connected to the AP and the PMIC, respectively. In detail, one end and the other end of the coil 180a such as the power inductor (PI) may be electrically connected to $V_{in}$ of the AP and $V_{out}$ of the PMIC, respectively.

The semiconductor chip 120 may include a body 121, the connection pads 122 formed on one surface of the body 121, and a passivation layer 123 formed on the body 121 and covering portions of the connection pads 122. The body 121 may be formed on the basis of, for example, an active wafer. In this case, silicon (Si), germanium (Ge), gallium arsenide (GaAs), or the like, may be used as a basic material of the body 121. The connection pads 122 may electrically connect the semiconductor chip 120 to other components, and a conductive material such as aluminum (Al), or the like, may be used as a material of each of the connection pads 122. The connection pads 122 may be redistributed by the second connection member 140, the first connection member 110, and the like. A surface of the semiconductor chip 120 on which the connection pads 122 are formed may be an active surface, and an opposite surface of the semiconductor chip 120 to the active surface may be an inactive surface. The passivation layer 123 may serve to protect the body 121 from external impacts, and may be formed of, for example, an oxide film formed of SiO, etc., a nitride film formed of SiN, etc., or the like, or be formed of a double layer including an oxide film and a nitride film. In addition, an insulating layer, or the like, formed of SiO, etc., may be further disposed between the body 121 and the connection pads 112 or between the body 121 and the passivation layer 123.

The lower surface of the first redistribution layer 112a of the first connection member 110 may be disposed on a level higher than a lower surface of the connection pad 122 of the semiconductor chip 120. In addition, a distance between a redistribution layer 142 of the second connection member 140 and the first redistribution layer 112a of the first connection member 110 may be greater than that between the redistribution layer 142 of the second connection member 140 and the connection pad 122 of the semiconductor chip 120. The reason is that the first redistribution layer 112a may be recessed in the first insulating layer 111a. That is, a lower surface the first insulating layer 111a may have a step with respect to the lower surface of the first redistribution layer 112a. Similarly, a lower surface of the first coil pattern layer 112a-i of the first connection member 110 may be disposed on a level higher than a lower surface of the connection pad 122 of the semiconductor chip 120. In addition, a distance between the redistribution layer 142 of the second connection member 140 and the first coil pattern layer 112a-i of the first connection member 110 may be greater than that between the redistribution layer 142 of the second connection member 140 and the connection pad 122 of the semiconductor chip 120. That is, the lower surface of the first insulating layer 111a may have a step with respect to a lower surface of a first coil pattern layer 182a-i. The second redistribution layer 112b of the first connection member 110 may be disposed on a level between the active surface and the inactive surface of the semiconductor chip 120. The first connection member 110 may be formed at a thickness corresponding to that of the semiconductor chip 120. Therefore, the second redistribution layer 112b formed in the first connection member 110 may be disposed on a level between the active surface and the inactive surface of the semiconductor chip 120. Similarly, the second coil pattern layer 112b-i of the first connection member 110 may be disposed on a level between the active surface and the inactive surface of the semiconductor chip 120.

The encapsulant 130 may be configured to protect the first connection member 110 or the semiconductor chip 120. An encapsulation form of the encapsulant 130 is not particularly limited, but may be a form in which the encapsulant 130 surrounds at least portions of the first connection member 110 or the semiconductor chip 120. For example, the encapsulant 130 may fill the first connection member 110, the other surface of the semiconductor chip 120, and a space between the first connection member 110 and the semiconductor chip 120 within the through-hole 110H. In addition, the encapsulant 130 may also fill at least a portion of a space between the passivation layer 123 of the semiconductor chip 120 and the second connection member 140. Meanwhile, the encapsulant 130 may fill the through-hole 110H to thus serve as an adhesive and reduce buckling of the semiconductor chip 120 depending on materials. Openings opening at least portions of the second redistribution layer 112b formed on the other surface of the first connection member 110 may be formed in the encapsulant 130. The opened portions of the second redistribution layer 112b may be utilized as marking patterns. Alternatively, separate connection terminals, or the like, may be connected to the opened portions of the second redistribution layer 112b to thus be applied to a packageon-package structure, and a surface mount technology (SMT) component may be disposed on the opened portions of the second redistribution layer 112b.

Materials of the encapsulant 130 are not particularly limited, but may be, for example, an insulating material. In more detail, for example, ABF, or the like, that includes an inorganic filler and an insulating resin, but does not include a glass cloth may be used as a material of the encapsulant 130. In this case, a void problem or a delamination problem may be solved. Meanwhile, the inorganic filler may be the known inorganic filler, and the insulating resin may be the known epoxy resin, or the like. However, the inorganic filler and the insulating resin are not limited thereto.

The second connection member 140 may be configured to redistribute the connection pads 122 of the semiconductor chip 120 to a fan-in region or a fan-out region. Several tens to several hundreds of connection pads 122 having various functions may be redistributed by the second connection member 140, and may be physically or electrically connected to an external source through connection terminals 170 to be described below depending on the functions. The second connection member 140 may include insulating layers 141, redistribution layers 142 disposed on the insulating layers 141, and via layers 143 penetrating through the insulating layers 141 and connecting the redistribution layers 142 to each other.

An insulating material may be used as a material of each of the insulating layers 141. In this case, a photosensitive insulating material such as a PID resin may also be used as the insulating material. In this case, the insulating layer 141 may be formed to have a smaller thickness, and a fine pitch of vias of the via layers 143 may be achieved more easily. The materials of the insulating layers 141 may be the same as each other or may be different from each other, if necessary. The insulating layers 141 may be integrated with each other depending on processes, so that a boundary therebetween may not be readily apparent.

The redistribution layers 142 may substantially serve to redistribute the connection pads 122, and a conductive material such as copper (Cu), aluminum (Al), silver (Ag), tin (Sn), gold (Au), nickel (Ni), lead (Pb), titanium (Ti), or alloys thereof, may be used as a material of each of the redistribution layers 142. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include via pads, connection terminal pads, and the like. A surface treatment layer may further be formed on portions of the redistribution layer 142 externally opened from the redistribution layers 142, if necessary.

The via layers 143 may electrically connect the redistribution layers 142, the connection pads 122, or the like, formed on different layers, resulting in an electrical path in the fan-out semiconductor package 100A. A conductive material such as copper (Cu), aluminum (Al), silver (Ag), tin (Sn), gold (Au), nickel (Ni), lead (Pb), titanium (Ti), or alloys thereof, may be used as a material of each of the via layers 143. The via layers 143 may also be entirely filled with a conductive material, or a conductive material may be formed along a wall of each of the vias. In addition, the via layer 143 may have all of the shapes known in the related art, such as a tapered shape, a cylindrical shape, and the like.

A case in which the second connection member 140 has one of the insulating layer 141 and one of the redistribution layer 142 and one of the via layer 143 depending on one insulating layer 141 is illustrated in the drawing, but the second connection member 140 is not limited thereto. That is, the second connection member 140 may include a larger number of insulating layers depending on its design, and thus include a larger number of distribution layers and via layers. That is, the second connection member 140 may also be formed of a plurality of layers.

Thicknesses of the redistribution layers 112a, 112b, and 112c of the first connection member 110 may be greater than that of the redistribution layer 142 of the second connection member 140. Since the first connection member 110 may have a thickness equal to or greater than that of the semiconductor chip 120, the redistribution layers 112a, 112b, and 112c may be formed to be relatively large, depending on a scale of the first connection member 110. On the other hand, the redistribution layer 142 of the second connection member 140 may be formed to be relatively small, for thinness. Similarly, thicknesses of the first to third coil pattern layers 112a-i, 112b-i, and 112c-i of the first connection member 110 may be greater than that of the redistribution layer 142 of the second connection member 140.

The passivation layer 150 may be introduced, if necessary, and may be configured to protect the second connection member 140 from external physical or chemical damage. The passivation layer 150 may have the openings 151 exposing portions of the redistribution layer 142 of the second connection member 140, that is, at least some of the connection terminal pads. The number of openings 151 formed in the passivation layer 150 may be several tens to several thousands.

A material of the passivation layer 150 is not particularly limited, but may be a photosensitive insulating material such as a PID resin. Alternatively, a solder resist may also be used as a material of the passivation layer 150. Alternatively, an insulating material that includes a filler and a resin, but does not include a glass cloth, such as ABF, or the like, may be used as a material of the passivation layer 150. A surface roughness of the passivation layer 150 may be lower as compared to a general case. When the surface roughness is low as described above, several side effects that may ensue in a circuit forming process, for example, generation of a stain on a surface, difficulty in implementing a fine circuit, and the like, may be improved.

The underbump metal layer 160 may be introduced, if necessary, and may improve connection reliability of connection terminals 170 to be described below to thus improve reliability of the fan-out semiconductor package. The underbump metal layer 160 may be formed on the insulating layer 141 or the openings 151 of the passivation layer 150 to be connected to the opened portions of the redistribution layer 142. The underbump metal layer 160 may include a seed layer and a conductor layer formed on the seed layer. The seed layer and the conductor layer may include the known conductive materials, preferably, electroless copper and electrolytic copper, respectively. The seed layer may have a thickness smaller than that of the conductor layer.

The connection terminals 170 may be configured to physically or electrically externally connect the fan-out semiconductor package 100A. For example, the fan-out semiconductor package 100A according to the exemplary embodiment may be directly mounted on the main board of the electronic device through the connection terminals 170. Each of the connection terminals 170 may be formed of a conductive material such as a solder, or the like. However, this is only an example, and a material of each of the connection terminals 170 is not limited thereto.

Each of the connection terminals 170 may be a land, a ball, a pin, or the like. The connection terminal 170 may be formed of multiple layers or a single layer. When the connection terminals 170 are formed of the multiple layers, the connection terminals 170 may include a copper pillar and a solder. When the connection terminals 170 are formed of the single layer, the connection terminals 170 may include a tin-silver solder or copper. However, this is only an example, and the connection terminals 170 are not limited thereto. The number, an interval, a disposition form, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of several tens to several thousands or more or several tens to several thousands or less.

At least one of the connection terminals 170 may be disposed in a fan-out region. The fan-out region is a region except for the region in which the semiconductor chip 120 is disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a small thickness, and may have price competitiveness.

Although not illustrated in the drawings, a separate metal layer may be further disposed on an inner wall of the through-hole 110H of the first connection member 110, if necessary, in order to radiate heat and block an electromagnetic wave. In addition, if necessary, a plurality of semiconductor chips may be disposed in the through-hole 110H of the first connection member 110, and the number of through-holes 110H of the first connection member 110 may be plural and semiconductor chips may be disposed in the through-holes, respectively. In addition, separate passive components such as a capacitor, and the like, may be encapsulated together with the semiconductor chip in the through-hole 110H. In addition, a surface mount technology (SMT) component may be mounted on the passivation layer 150.

Figure 11A:
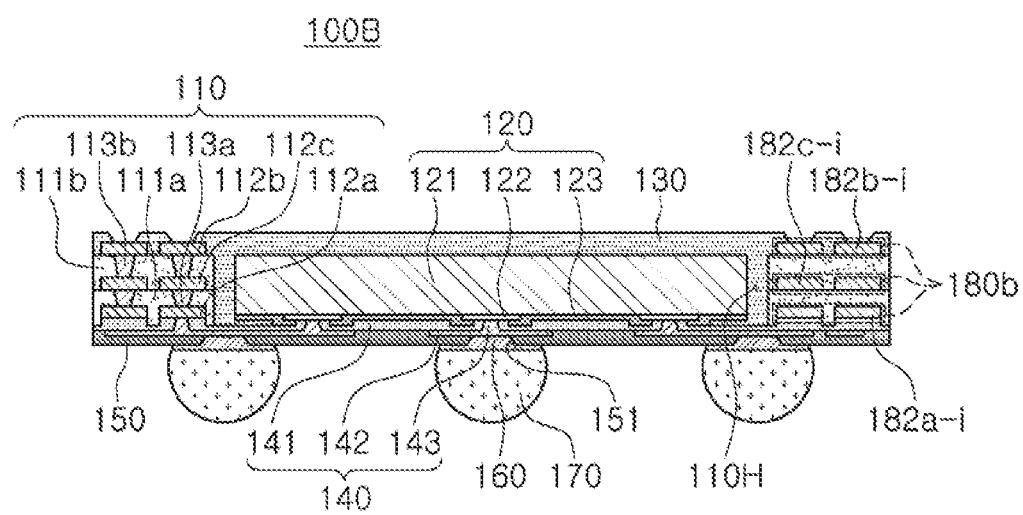
FIGS. 11A and 11B are schematic views illustrating a fan-out semiconductor package according to another exemplary embodiment in the present disclosure.
Figure 11B:
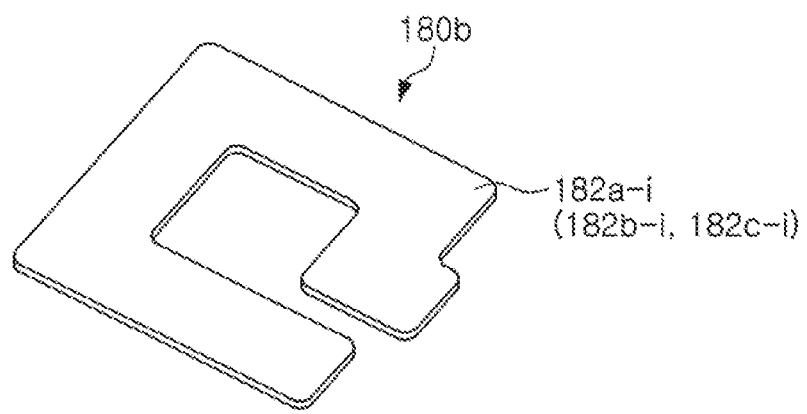

FIGS. 11A and 11B are schematic views illustrating a fan-out semiconductor package according to anther exemplary embodiment in the present disclosure.

Referring to the drawings, in a fan-out semiconductor package 100B according to the present exemplary embodiment, all of first to third coil pattern layers 112*a-i*, 112*b-i*, and 112*c-i* may independently include coil patterns, and these coil patterns may independently form coils 180*b* of which central axes correspond to a stacking direction of the first to third coil pattern layers 112*a-i*, 112*b-i*, and 112*c-i*, respectively. That is, a first connection member 110 may include a plurality of coils 180*b* stacked in a vertical direction, independent of one another, and having a plane coil shape. In some cases, the plurality of coils 180*b* may be connected to each other in parallel among the respective layers to reduce direct current (DC) resistance (Rdc) of an inductor. Meanwhile, the number of coil pattern layers does not necessarily depend on the number of redistribution layers. That is, in some cases, the number of redistribution layers may be greater than that of coil pattern layers. That is, even in the case that the number of redistribution layers is three or more, the number of coil pattern layers independently forming the coils may be only one or be only two. Descriptions of configurations overlapping the previously described configuration will be omitted.

Figure 12A:
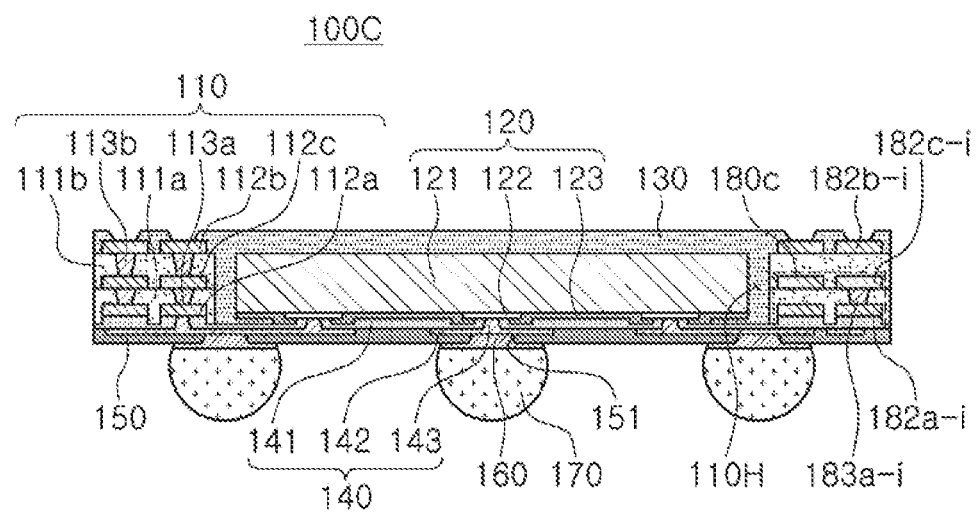
FIGS. 12A and 12B are schematic views illustrating a fan-out semiconductor package according to another exemplary embodiment in the present disclosure.
Figure 12B:
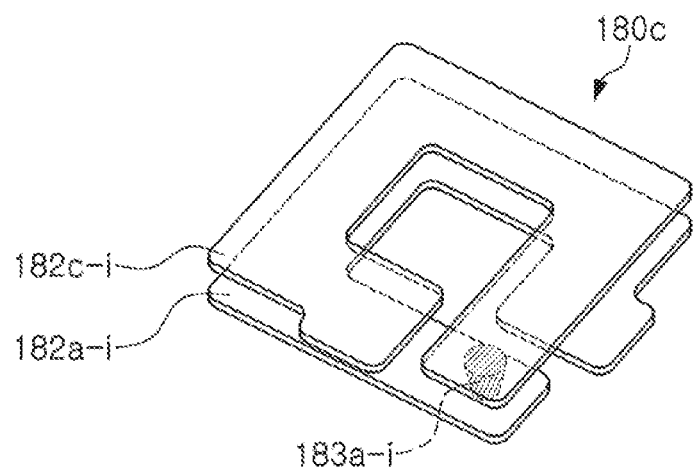

FIGS. 12A and 12B are schematic views illustrating a fan-out semiconductor package according to another exemplary embodiment in the present disclosure.

Referring to the drawings, in a fan-out semiconductor package 100C according to the present exemplary embodiment, a first connection member 110 may include first to third redistribution layers 112*a*, 112*b*, and 112*c*. However, the first connection member 110 may include only first and second coil pattern layers 112*a-i* and 112*b-i*. Coil patterns included in the first and second coil pattern layers 112*a-i* and 112*b-i* may be electrically connected to each other through a via 183*a-i* to form a coil 180*c* of which a central axis corresponds to a stacking direction of the first and second coil pattern layers 112*a-i* and 112*b-i*. That is, the number of redistribution layers and the number of coil pattern layers are not necessarily the same as each other. Descriptions of configurations overlapping the previously described configuration will be omitted.

Figure 13A:
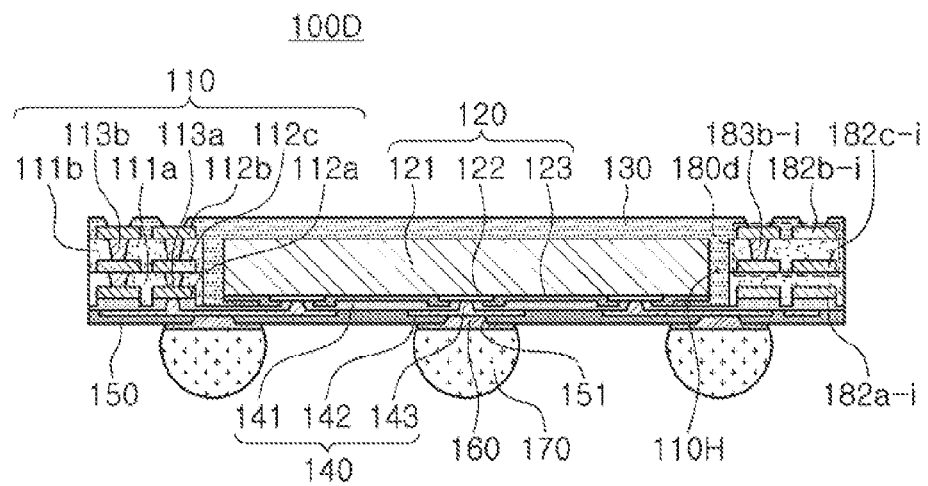
FIGS. 13A and 13B are schematic views illustrating a fan-out semiconductor package according to another exemplary embodiment in the present disclosure.
Figure 13B:
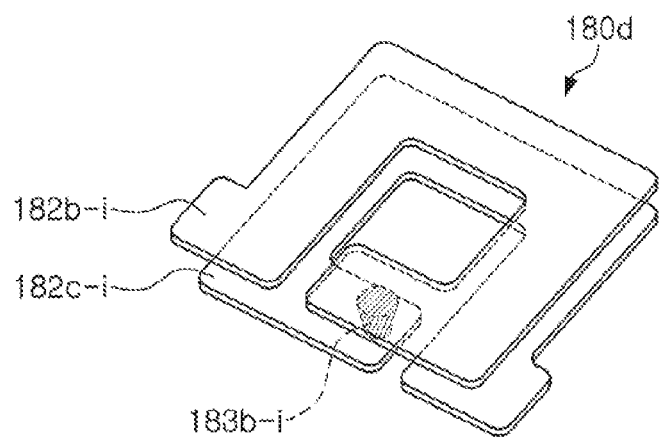

FIGS. 13A and 13B are schematic views illustrating a fan-out semiconductor package according to another exemplary embodiment in the present disclosure.

Referring to the drawings, in a fan-out semiconductor package 100D according to the present exemplary embodiment, a first connection member 110 may include first to third redistribution layers 112*a*, 112*b*, and 112*c*. However, the first connection member 110 may include only second and third coil pattern layers 112*b-i* and 112*c-i*. Coil patterns included in the second and third coil pattern layers 112*b-i* and 112*c-i* may be electrically connected to each other through a via 183*b-i* to form a coil 180*d* of which a central axis corresponds to a stacking direction of the second and third coil pattern layers 112*b-i* and 112*c-i*. That is, the number of redistribution layers and the number of coil pattern layers are not necessarily the same as each other. Descriptions of configurations overlapping the previously described configuration will be omitted.

Figure 14A:
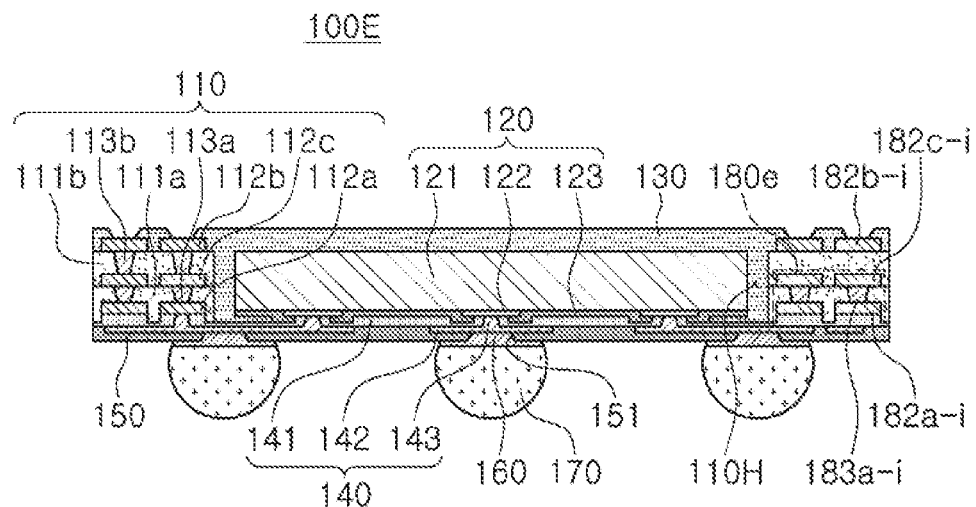
FIGS. 14A and 14B are schematic views illustrating a fan-out semiconductor package according to another exemplary embodiment in the present disclosure.
Figure 14B:
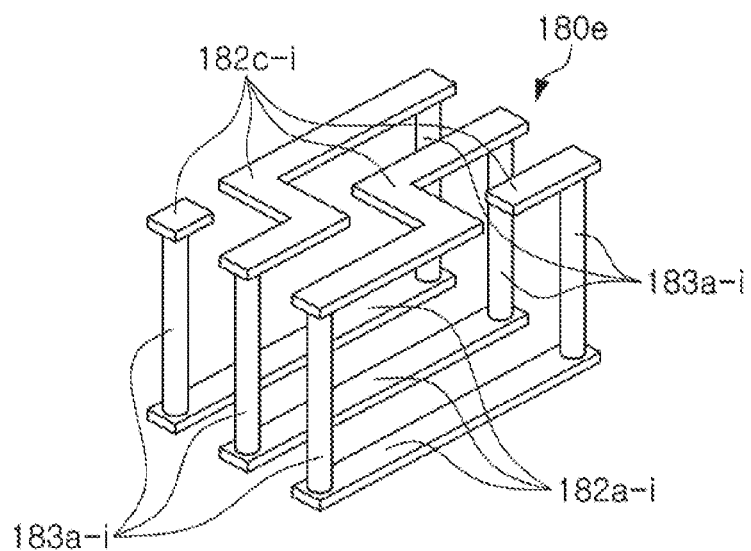

FIGS. 14A and 14B are schematic views illustrating a fan-out semiconductor package according to another exemplary embodiment in the present disclosure.

Referring to the drawings, in a fan-out semiconductor package 100E according to the present exemplary embodiment, each of first and second coil pattern layers 112*a-i* and 112*b-i* may include a plurality of coil patterns, and the plurality of coil patterns may be electrically connected to each other through a plurality of vias 183*a-i* to form a coil 180*e* of which a central axis corresponds to a direction perpendicular to a stacking direction of the first and second coil pattern layers 112*a-i* and 112*b-i*. The plurality of coil patterns formed in each of the first and second coil pattern layers 112*a-i* and 112*b-i* may be disconnected from each other on the same layers. The coil 180*e* may have a spiral path rotating while alternately passing coil patterns of each of coil pattern layers 182*a-i* and 182*b-i* through the plurality of vias 183*a-i* based on the central axis. Descriptions of configurations overlapping the previously described configuration will be omitted.

Figure 15A:
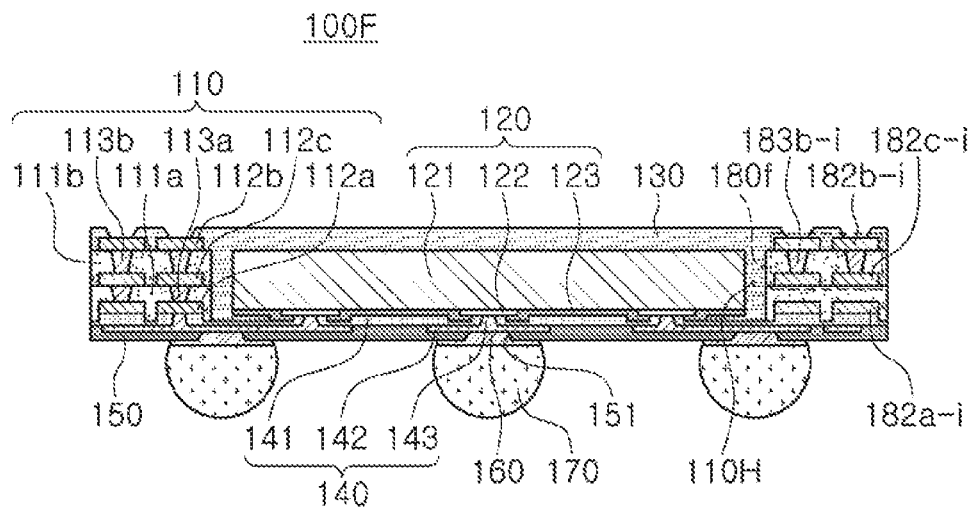
FIGS. 15A and 15B are schematic views illustrating a fan-out semiconductor package according to another exemplary embodiment in the present disclosure.
Figure 15B:
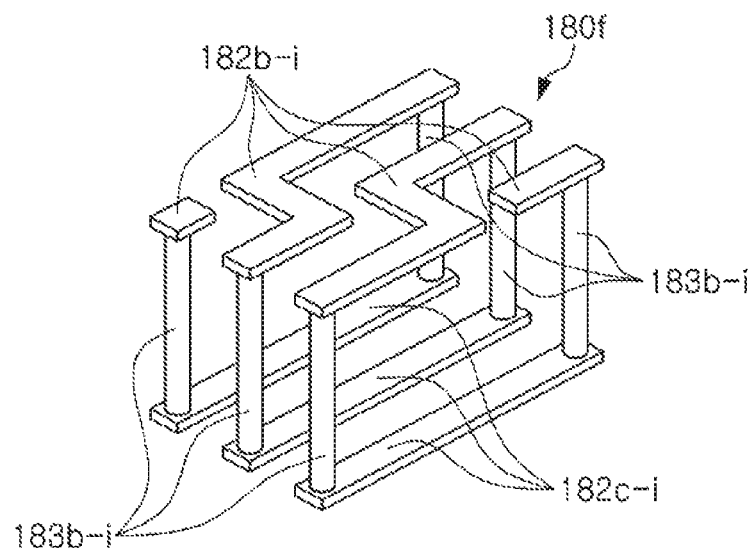

FIGS. 15A and 15B are schematic views illustrating a fan-out semiconductor package according to another exemplary embodiment in the present disclosure.

Referring to the drawings, in a fan-out semiconductor package 100F according to the present exemplary embodiment, each of second and third coil pattern layers 112*b-i* and 112*c-i* may include a plurality of coil patterns, and the plurality of coil patterns may be electrically connected to each other through a plurality of vias 183*b-i* to form a coil 180*f* of which a central axis corresponds to a direction perpendicular to a stacking direction of the second and third coil pattern layers 112*b-i* and 112*c-i*. The plurality of coil patterns formed in each of the second and third coil pattern layers 112*b-i* and 112*c-i* may be disconnected from each other on the same layers. The coil 180*f* may have a spiral path rotating while alternately passing coil patterns of each of coil pattern layers 182*b-i* and 182*c-i* through the plurality of vias 183*b-i* based on the central axis. Descriptions of configurations overlapping the previously described configuration will be omitted.

Figure 16A:
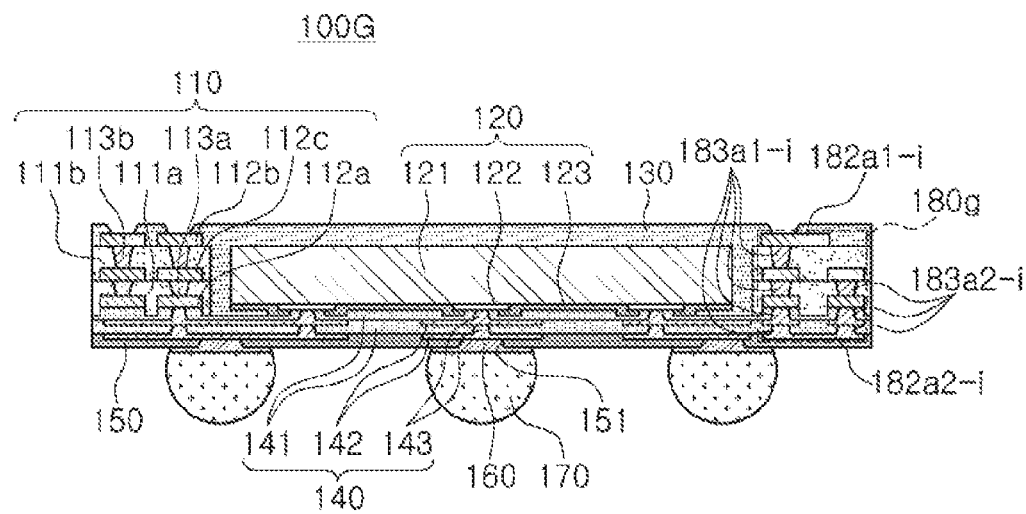
FIGS. 16A and 16B are schematic views illustrating a fan-out semiconductor package according to another exemplary embodiment in the present disclosure.
Figure 16B:
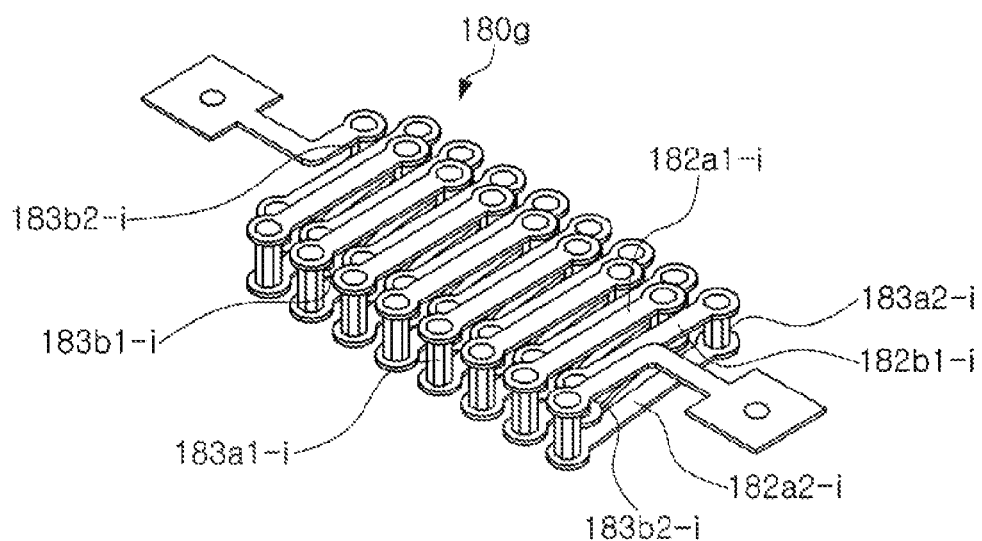

FIGS. 16A and 16B are schematic views illustrating a fan-out semiconductor package according to another exemplary embodiment in the present disclosure.

Figure 17A:
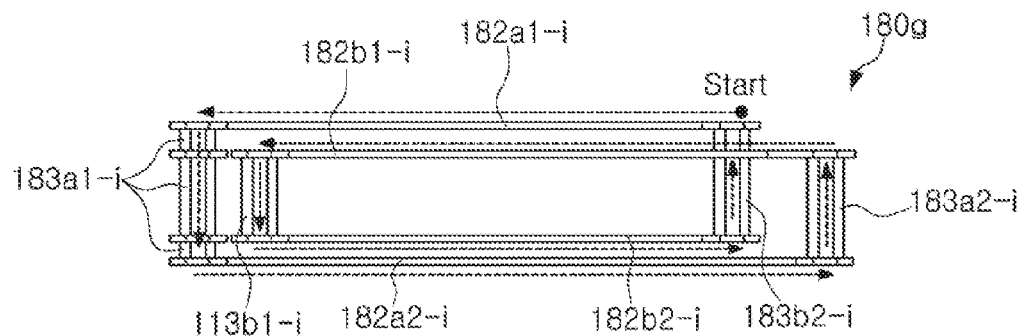
FIGS. 17A through 17C are schematic cross-sectional views illustrating various modifications of a coil formed in a fan-out semiconductor package of FIG. 16A.
Figure 17B:
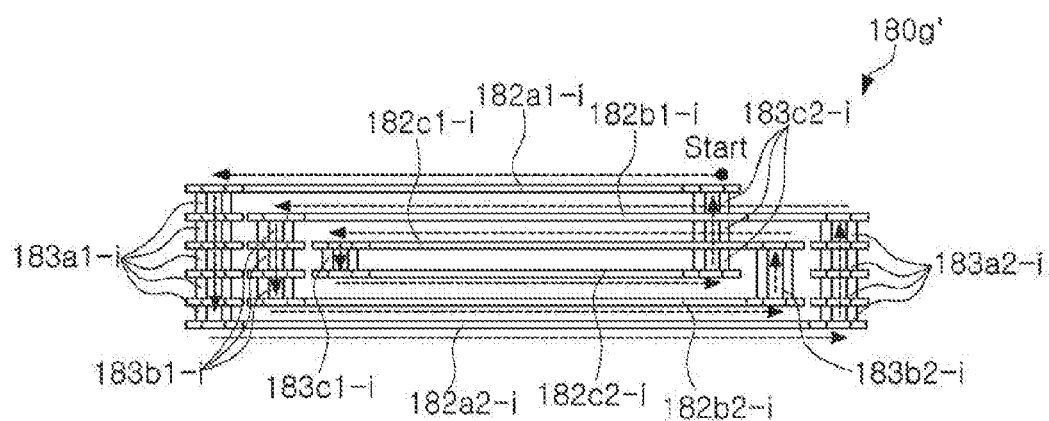
Figure 17C:
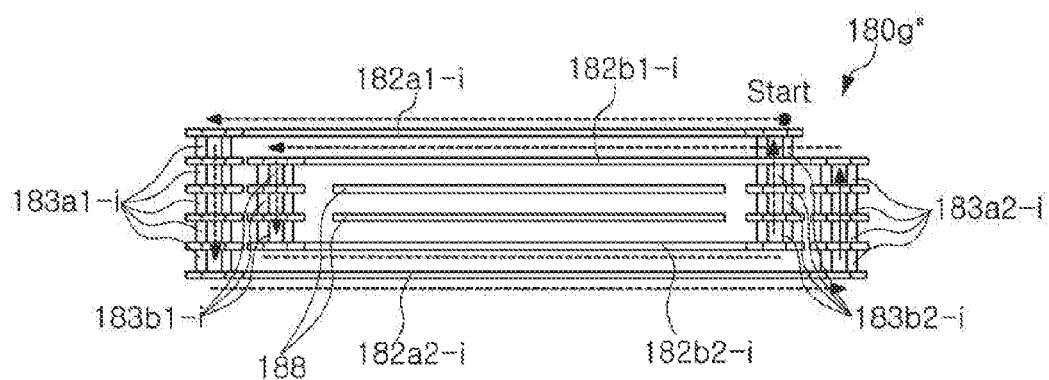

FIGS. 17A through 17C are schematic cross-sectional views illustrating various modifications of a coil formed in the fan-out semiconductor package of FIG. 16A.

Referring to the drawings, in a fan-out semiconductor package 100G according to the present exemplary embodiment, a first connection member 110 and a second connection member 140 may include coil pattern layers 182*a*1-*i*, 182*a*2-*i*, 182*b*1-*i*, and 182*b*2-*i* electrically connected to a connection pad 122 of a semiconductor chip 120. The coil pattern layers 182*a*1-*i*, 182*a*2-*i*, 182*b*1-*i*, and 182*b*2-*i* included in each of the first connection member 110 and the second connection member 140 are electrically connected to each other to form a coil 180*g*. In more detail, the first connection member 110 may include a plurality of first coil pattern layers 182*a*1-*i*, 182*b*1-*i*, and 182*b*2-*i*, and the second connection member 140 may include at least one second coil pattern layer 182*a*2-*i*. A plurality of coil patterns included in each of the plurality of first coil pattern layers 182*a*1-*i*, 182*b*1-*i*, and 182*b*2-*i* and a plurality of coil patterns included in each of the at least one second coil pattern layer 182*a*2-*i* are electrically connected to each other through a plurality of vias 183*a*1-*i*, 183*a*2-*i*, 183*b*1-*i*, and 183*b*2-*i* formed in the first connection member 110 and the second connection member 140 to form the coil 180*g* of which a central axis corresponds to a direction perpendicular to a stacking direction of the plurality of first coil pattern layers 182*a*1-*i*, 182*b*1-*i*, and 182*b*2-*i* and the at least one second coil pattern layer 182*a*2-*i*. In this case, it is possible to have a large number of turns within a limited space, thereby effectively improving inductance characteristics.

Meanwhile, as illustrated in FIG. 17A, a coil 180*g* may include a plurality of outer layers 182*a*1-*i* and 182*a*2-*i* of a plurality of first coil pattern layers 182*a*1-*i*, 182*a*2-*i*, and 182*b*1-*i* and at least one second coil pattern layer 182*b*2-*i*, composed of layers disposed on an uppermost layer and a lowermost layer based on a stacking direction, and a plurality of inner layers 182*b*1-*i* and 182*b*2-*i* of the plurality of first coil pattern layers 182*a*1-*i*, 182*a*2-*i*, and 182*b*1-*i* and the at least one second coil pattern layer 182*b*2-*i*, composed of layers disposed between the plurality of outer layers 182*a*1-*i* and 182*a*2-*i*. The coil 180*g* may have a spiral path rotating while alternately passing the plurality of outer layers 182*a*1-*i* and 182*a*2-*i* and the plurality of inner layers 182*b*1-*i* and 182*b*2-I through a plurality of vias 183*a*1-*i*, 183*a*2-*i*, 183*b*1-*i*, and 183*b*2-*i* based on a central axis. In more detail, the spiral path of the coil 180*g*, for example, may move from a first outer layer 182*a*1-*i* through a first outer layer via 183*a*1-*i* to a second outer layer 182*a*2-*i*, may move through a second outer layer via 183*a*2-*i* to a first inner layer 182*b*1-*i* thereafter, may move through a first inner layer via 183*b*1-*i* to a second inner layer 182*b*2-*i* thereafter, and may move through a second inner layer via 183*b*2-*i* to the first outer layer 182*a*1-*i* again. Thus, the spiral path rotates by a repetition of the path described above. In this case, it is possible to have a large number of turns within a limited space, thereby effectively improving inductance characteristics.

In addition, as illustrated in FIG. 17B, a larger number of second coil pattern layers 182*a*2-*i*, 182*b*2-*i*, and 182*c*2-*i* may be formed in a second connection member 140. In this case, first and second inner layers 182*b*1-*i* and 182*b*2-*i* in addition to third and fourth inner layers 182*c*1-*i* and 182*c*2-*i* of a plurality of inner layers 182*b*1-*i*, 182*b*2-*i*, 182*c*1-*i*, and 182*c*2-*i* of a coil 180*g'* are connected to each other through a plurality of vias 183*b*1-*i*, 183*b*2-*i*, 183*c*1-*i*, and 183*c*2-*i* as similarly described above to form a spiral path rotating while alternately passing the first and second inner layers 182*b*1-*i* and 182*b*2-*i* in addition to the third and fourth inner layers 182*c*1-*i* and 182*c*2-*i* through the plurality of vias 183*b*1-*i*, 183*b*2-*i*, 183*c*1-*i*, and 183*c*2-*i* based on a central axis. In more detail, the spiral path of the coil 180*g'*, for example, may move from a first outer layer 182*a*1-*i* through a first outer layer via 183*a*1-*i* to a second outer layer 182*a*2-*i*, may move through a second outer layer via 183*a*2-*i* to a first inner layer 182*b*1-*i* thereafter, may move through a first inner layer via 183*b*1-*i* to a second inner layer 182*b*2-*i* thereafter, may move through a second inner layer via 183*b*2-*i* to a third inner layer 182*c*1-*i* thereafter, may move through a third inner layer via 183*c*1-*i* to a fourth inner layer 182*c*2-*i* thereafter, and may move through a fourth inner layer via 183*c*2-*i* to the first outer layer 182*a*1-*i* again. Thus, the spiral path rotates by a repetition of the path described above. In this case, it is possible to have a larger number of turns within a limited space, thereby effectively improving inductance characteristics.

In addition, as illustrated in FIG. 17C, in the coil 180*g'* illustrated in FIG. 17B, a coil pattern may not be formed between the plurality of inner layers 182*b*1-*i* and 182*b*2-*i*, and a magnetic layer 188 may be formed in a layer in which a coil pattern is not formed as required. The magnetic layer 188 may include a magnetic material known in the art. When the layer in which a coil pattern is not formed between the plurality of inner layers 182*b*1-*i* and 182*b*2-*i* is introduced, inductance characteristics may be improved by securing an air core of an inductor. In addition, when the magnetic layer 188 is formed in the layer in which a coil pattern is not formed, inductance characteristics of a coil 180*g"* may be further improved due to magnetic properties of the magnetic layer 188. Meanwhile, a spiral path of the coil 180*g"*, for example, may move from a first outer layer 182*a*1-*i* through a first outer layer via 183*a*1-*i* to a second outer layer 182*a*2-*i*, may move through a second outer layer via 183*a*2-*i* to a first inner layer 182*b*1-*i* thereafter, may move through a first inner layer via 183*b*1-*i* to a second inner layer 182*b*2-*i* thereafter, and may move through a second inner layer via 183*b*2-*i* to the first outer layers 182*a*1-*i* again. Thus, the spiral path rotates by a repetition of the path described above.

Figure 18A:
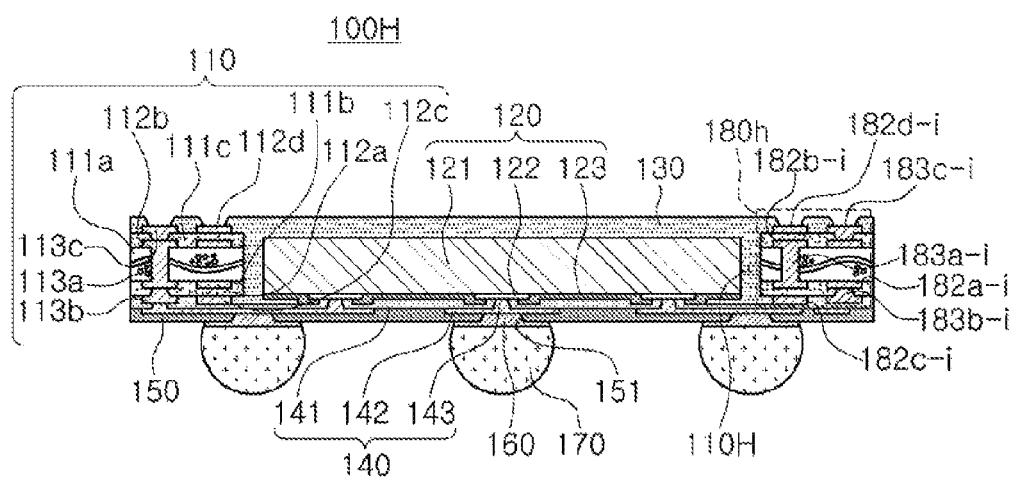
FIGS. 18A and 18B are schematic views illustrating a fan-out semiconductor package according to another exemplary embodiment in the present disclosure.
Figure 18B:
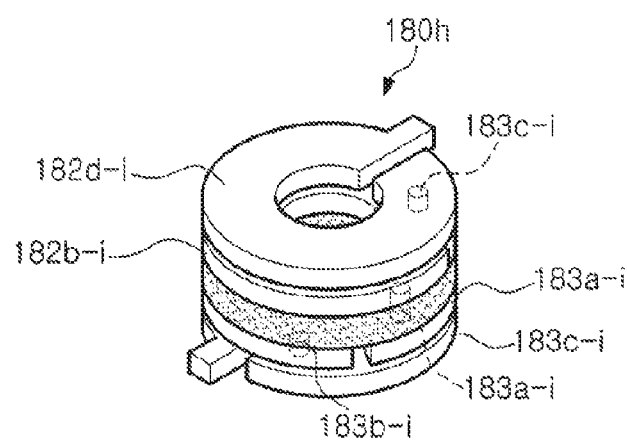

FIGS. 18A and 18B are schematic views illustrating a fan-out semiconductor package according to another exemplary embodiment in the present disclosure.

Referring to the drawing, in a fan-out semiconductor package 100H according to the present exemplary embodiment, a first connection member 110 may include a first insulating layer 111a, a first redistribution layer 112a and a second redistribution layer 112b disposed on both surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to each other through first to third via layers 113a, 113b, and 113c penetrating through the first to third insulating layers 111a, 111b, and 111c.

In addition, the first connection member 110 may include first and second coil pattern layers 112a-i and 112b-i disposed on both surfaces of the first insulating layer 111a, respectively, a third coil pattern layer 112c-i disposed on the second insulating layer 111b, and a fourth coil pattern layer 112d-i disposed on the third insulating layer 111c. The first to fourth coil pattern layers 112a-i, 112b-i, 112c-i, and 112d-i may be electrically connected to each other through first to third via layers 113a-i, 113b-i, and 113c-i to form a coil 180h of which a central axis corresponds to a stacking direction of the first to fourth coil pattern layers 112a-i, 112b-i, 112c-i, and 112d-i. In some case, the first connection member 110 may include a smaller number of coil pattern layers, and the coil pattern layers may independently form the respective coils. In addition, some coil pattern layers may include a plurality of coil patterns, and the plurality of coil patterns may be electrically connected to each other through a plurality of vias to form a coil of which a central axis is perpendicular to a stacking direction of the plurality of coil pattern layers. That is, various forms of the coils described above may also be applied to the fan-out semiconductor package 100G.

The first insulating layer 111a may have a thickness greater than those of the second insulating layer 111b and the third insulating layer 111c. The first insulating layer 111a may basically be relatively thick in order to maintain rigidity, and the second and third insulating layers 111b and 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a glass cloth, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto.

A lower surface of the third redistribution layer 112c of the first connection member 110 may be disposed on a level below a lower surface of the connection pads 122 of the semiconductor chip 120. In addition, a distance between a redistribution layer 142 of the second connection member 140 and the third redistribution layer 112c of the first connection member 110 may be smaller than that between the redistribution layer 142 of the second connection member 140 and the connection pad 122 of the semiconductor chip 120. The reason is that the third redistribution layer 112c may be disposed in a protruding form on the second insulating layer 111b, resulting in contacting the second connection member 140. Similarly, a lower surface of the third coil pattern layer 112c-i of the first connection member 110 may be disposed on a level below a lower surface of the connection pad 122 of the semiconductor chip 120. In addition, a distance between a redistribution layer 142 of the second connection member 140 and the third coil pattern layer 112c-i of the first connection member 110 may be smaller than that between the redistribution layer 142 of the second connection member 140 and the connection pad 122 of the semiconductor chip 120.

The first redistribution layer 112a and the second redistribution layer 112b of the first connection member 110 may be disposed on a level between an active surface and an inactive surface of the semiconductor chip 120. The first connection member 110 may be formed at a thickness corresponding to that of the semiconductor chip 120. Therefore, the first redistribution layer 112a and the second redistribution layer 112b formed in the first connection member 110 may be disposed on a level between the active surface and the inactive surface of the semiconductor chip 120. Similarly, the first coil pattern layer 112a-i and the second coil pattern layer 112b-i of the first connection member 110 may be disposed on a level between an active surface and an inactive surface of the semiconductor chip 120.

Thicknesses of the redistribution layers 112a, 112b, 112c, and 112d of the first connection member 110 may be greater than that of the redistribution layer 142 of the second connection member 140. Since the first connection member 110 may have a thickness equal to or greater than that of the semiconductor chip 120, the redistribution layers 112a, 112b, 112c, and 112d may also be formed to be relatively large. On the other hand, the redistribution layer 142 of the second connection member 140 may be formed to be relatively small, for thinness. Similarly, thicknesses of the first to fourth coil pattern layers 112a-i, 112b-i, 112c-i, and 112d-i of the first connection member 110 may be greater than that of the redistribution layer 142 of the second connection member 140. Descriptions of configurations overlapping the previously described configuration will be omitted.

Figure 19A:
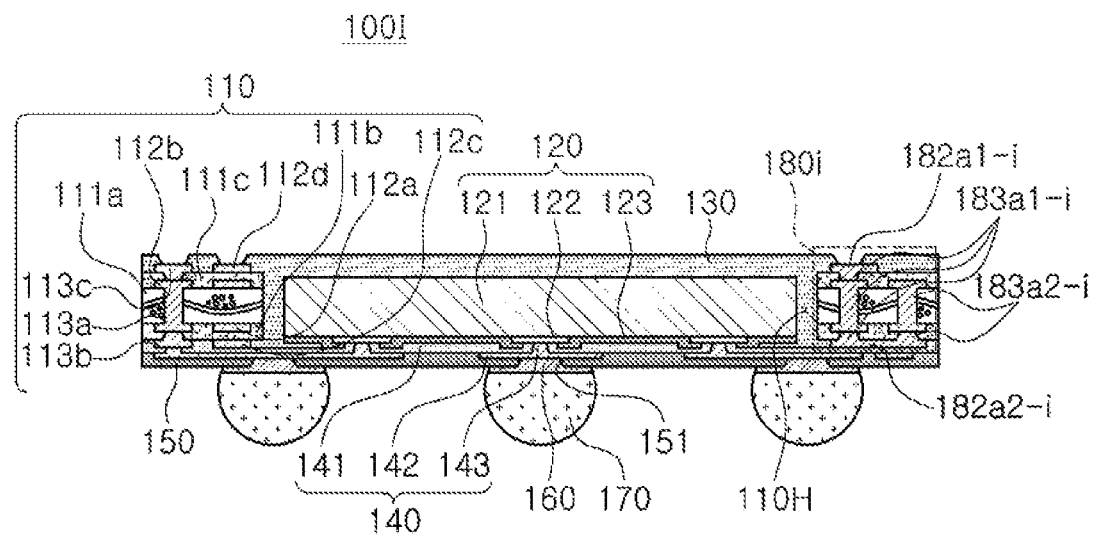
FIGS. 19A and 19B are schematic views illustrating a fan-out semiconductor package according to another exemplary embodiment in the present disclosure.
Figure 19B:
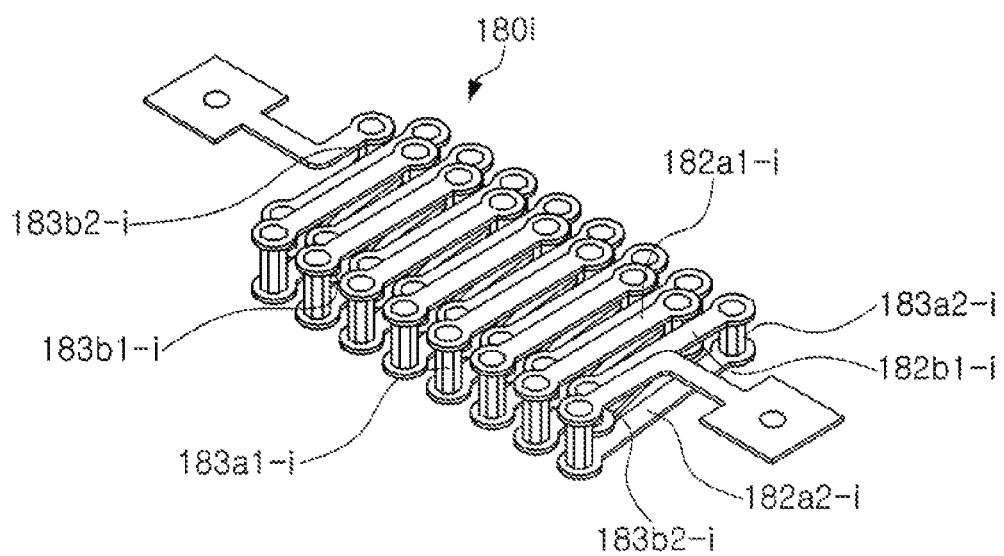

FIGS. 19A and 19B are schematic views illustrating a fan-out semiconductor package according to another exemplary embodiment in the present disclosure.

Referring to the drawings, in a fan-out semiconductor package 100I according to the present exemplary embodiment, a first connection member 110 may include a plurality of coil pattern layers 182a1-i, 182a2-i, 182b1-i, and 182b2-i electrically connected to a connection pad 122 of a semiconductor chip 120. A plurality of coil patterns included in each of the plurality of coil pattern layers 182a1-i, 182a2-i, 182b1-i, and 182b2-i are electrically connected to each other through a plurality of vias 183a1-i, 183a2-i, 183b1-i, and 183b2-i formed in the first connection member 110 to form a coil 180i of which a central axis corresponds to a direction perpendicular to a stacking direction of the plurality of coil pattern layers 182a1-i, 182a2-i, 182b1-i, and 182b2-i. The coil 180i may include a plurality of outer layers 182a1-i and 182a2-i of the plurality of coil pattern layers 182a1-i, 182a2-i, 182b1-i, and 182b2-i, composed of layers disposed on an uppermost layer and a lowermost layer based on a stacking direction, and a plurality of inner layers 182b1-i and 182b2-i of the plurality of coil pattern layers 182a1-i, 182a2-i, 182b1-i, and 182b2-i, composed of layers disposed between the plurality of outer layers 182a1-i and 182a2-i. The coil 180i may have a spiral path rotating while alternately passing the plurality of outer layers 182a1-i and 182a2-i and the plurality of inner layers 182b1-i and 182b2-i through the plurality of vias 183a1-i, 183a2-i, 183b1-i, and 183b2-*i* based on a central axis. Descriptions of configurations overlapping the previously described configuration will be omitted.

Figure 20A:
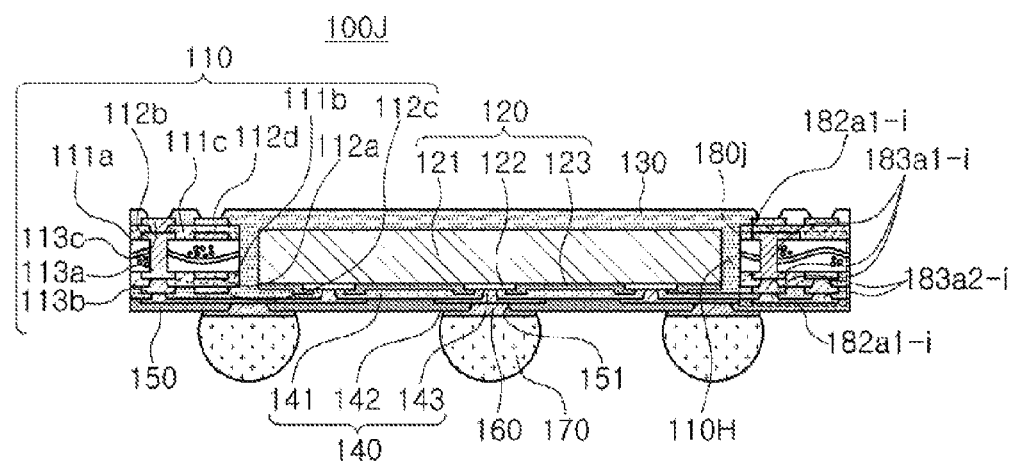
FIGS. 20A and 20B are schematic views illustrating a fan-out semiconductor package according to another exemplary embodiment in the present disclosure.
Figure 20B:
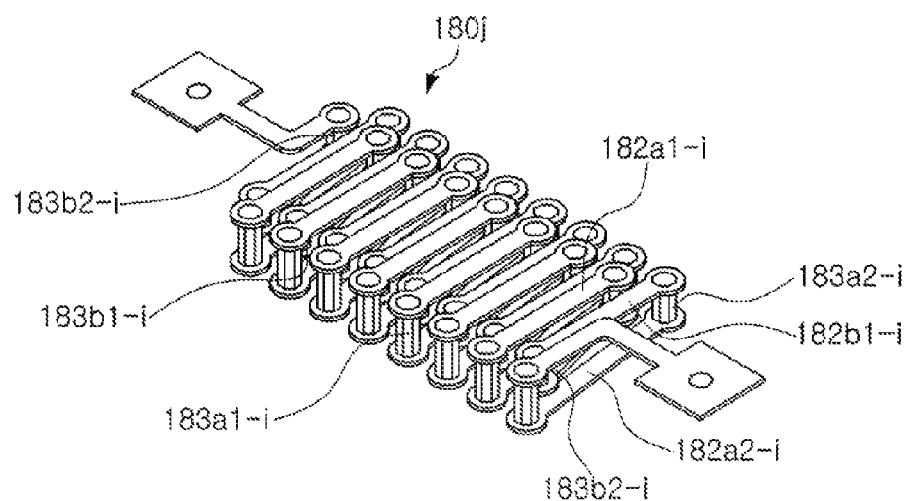

FIGS. 20A and 20B are schematic views illustrating a fan-out semiconductor package according to another exemplary embodiment in the present disclosure.

Referring to the drawings, in a fan-out semiconductor package 100J according to the present exemplary embodiment, a first connection member 110 and a second connection member 140 may include coil pattern layers 182a1-*i*, 182a2-*i*, 182b1-*i*, and 182b2-*i* electrically connected to a connection pad 122 of a semiconductor chip 120. The coil pattern layers 182a1-*i*, 182a2-*i*, 182b1-*i*, and 182b2-*i* included in each of the first connection member 110 and the second connection member 140 are electrically connected to each other to form a coil 180*j*. In more detail, the first connection member 110 may include a plurality of first coil pattern layers 182a1-*i*, 182b1-*i*, and 182b2-*i*, and the second connection member 140 may include at least one second coil pattern layer 182a2-*i*. A plurality of coil patterns included in each of the plurality of first coil pattern layers 182a1-*i*, 182b1-*i*, and 182b2-*i* and a plurality of coil patterns included in each of the at least one second coil pattern layer 182a2-*i* are electrically connected to each other through a plurality of vias 183a1-*i*, 183a2-*i*, 183b1-*i*, and 183b2-*i* formed in the first connection member 110 and the second connection member 140 to form the coil 180*j* of which a central axis corresponds to a direction perpendicular to a stacking direction of the plurality of first coil pattern layers 182a1-*i*, 182b1-*i*, and 182b2-*i* and the at least one second coil pattern layer 182a2-*i*. That is, a plurality of coil pattern layers 182a1-*i*, 182b1-*i*, and 182b2-*i* may only be formed in a portion of layers of the first connection member 110, and a remaining coil pattern layer 182a2-*i* may be formed in the second connection member 140. Meanwhile, although not illustrated in the drawing, a larger number of second coil pattern layers may be formed on the second connection member 140 as described above. Alternatively, a coil pattern may not be formed between a plurality of inner layers. In this case, a magnetic layer may be formed in a layer in which a coil pattern is not formed as required. Descriptions of configurations overlapping the previously described configuration will be omitted.

As set forth above, according to exemplary embodiments in the present disclosure, a fan-out semiconductor package is provided in which power supplying efficiency is excellent and cost may be reduced.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a first connection member having a through-hole;
a semiconductor chip disposed in the through-hole of the first connection member and having an active surface having connection pads disposed thereon and an inactive surface opposing the active surface;
an encapsulant encapsulating at least portions of the first connection member and the inactive surface of the semiconductor chip; and
a second connection member disposed on the first connection member and the active surface of the semiconductor chip,
wherein the first connection member and the second connection member include, respectively, redistribution layers electrically connected to the connection pads of the semiconductor chip, and
the first connection member includes a coil pattern layer electrically connected to the connection pads of the semiconductor chip.

2. The fan-out semiconductor package of claim 1, wherein the first connection member includes a plurality of first coil pattern layers, and
a coil pattern included in each of the plurality of coil pattern layers forms a coil of which a central axis independently corresponds to a stacking direction of the plurality of first coil pattern layers.

3. The fan-out semiconductor package of claim 1, wherein the first connection member includes a plurality of first coil pattern layers, and
a coil pattern included in each of the plurality of coil pattern layers is electrically connected to each other through a via formed in the first connection member to form a coil of which a central axis corresponds to a stacking direction of the plurality of first coil pattern layers.

4. The fan-out semiconductor package of claim 1, wherein the first connection member includes a plurality of first coil pattern layers,
a plurality of coil patterns included in each of the plurality of coil pattern layers are electrically connected to each other through a plurality of vias formed in the first connection member to form a coil of which a central axis corresponds to a direction perpendicular to a stacking direction of the plurality of first coil pattern layers.

5. The fan-out semiconductor package of claim 4, wherein the coil includes a plurality of outer layers composed of layers of the plurality of first coil pattern layers, disposed on an uppermost layer and a lowermost layer, based on the stacking direction, and a plurality of inner layers composed of layers of the plurality of first coil pattern layers, disposed between the plurality of outer layers,
the coil has a spiral path rotating while alternately passing through the plurality of outer layers and the plurality of inner layers based on the central axis.

6. The fan-out semiconductor package of claim 1, wherein the second connection member includes a second coil pattern layer electrically connected to a connection pad of the semiconductor chip, and
a coil pattern included in each of the first coil pattern layer and the second coil pattern layer is electrically connected to each other to form a coil.

7. The fan-out semiconductor package of claim 6, wherein the first connection member includes a plurality of first coil pattern layers,
the second connection member includes at least one second coil pattern layer, and
a plurality of coil patterns included in each of the plurality of first coil pattern layers and a plurality of coil patterns included in each of the at least one second coil pattern layer are electrically connected to each other through a plurality of vias formed in the first connection member and the second connection member to form a coil of which a central axis corresponds to a direction perpendicular to a stacking direction of the plurality of first coil pattern layers and the at least one second coil pattern layer.

8. The fan-out semiconductor package of claim 7, wherein the coil includes a plurality of outer layers composed of layers of the plurality of first coil pattern layers and the at least one second coil pattern layer, disposed on an uppermost layer and a lowermost layer, based on the stacking direction, and a plurality of inner layers composed of layers of the plurality of first coil pattern layers and the at least one second coil pattern layer, disposed between the plurality of outer layers, and the coil has a spiral path rotating while alternately passing through the plurality of outer layers and the plurality of inner layers based on the central axis.

9. The fan-out semiconductor package of claim 8, wherein, in at least one layer between the plurality of inner layers, a coil pattern is not formed therein.

10. The fan-out semiconductor package of claim 9, wherein, in the at least one layer in which a coil pattern is not formed, a magnetic layer is formed therein.

11. The fan-out semiconductor package of claim 1, wherein the first connection member includes a first region through a fourth region surrounding the semiconductor chip, and the first coil pattern layer is formed in a single region of the first region through the fourth region.

12. The fan-out semiconductor package of claim 1, wherein the semiconductor chip includes an application processor (AP) and a power management integrated circuit (PMIC), the first coil pattern layer forms a power inductor (PI), and one end and the other end of the PI are electrically connected to the AP and the PMIC, respectively.

13. The fan-out semiconductor package of claim 9, wherein a lower surface of the first redistribution layer is disposed on a level higher than a lower surface of the connection pad.

14. The fan-out semiconductor package of claim 9, wherein the second redistribution layer is disposed on a level between the active surface and the inactive surface of the semiconductor chip.

15. The fan-out semiconductor package of claim 1, wherein the first connection member includes a first insulating layer, a first redistribution layer and a second redistribution layer disposed on both surfaces of the first insulating layer, respectively, a second insulating layer disposed on the first insulating layer and covering the first redistribution layer, and a third redistribution layer disposed on the second insulating layer.

16. The fan-out semiconductor package of claim 15, wherein the first connection member further includes a third insulating layer disposed on the first insulating layer and covering the second redistribution layer and a fourth redistribution layer disposed on the third insulating layer.

17. The fan-out semiconductor package of claim 15, wherein the first insulating layer has a thickness greater than that of the second insulating layer.

18. The fan-out semiconductor package of claim 15, wherein the third redistribution layer has a thickness greater than that of the redistribution layer of the second connection member.

19. The fan-out semiconductor package of claim 15, wherein the first redistribution layer is disposed on a level between the active surface and the inactive surface of the semiconductor chip.

20. The fan-out semiconductor package of claim 15, wherein a lower surface of the third redistribution layer is disposed on a level below a lower surface of the connection pad.

* * * * *